United States Patent
Tanaka et al.

(10) Patent No.: US 11,069,803 B2
(45) Date of Patent: Jul. 20, 2021

(54) SEMICONDUCTOR DEVICE, METHOD OF MANUFACTURING SEMICONDUCTOR DEVICE, INVERTER CIRCUIT, DRIVING DEVICE, VEHICLE, AND ELEVATOR

(71) Applicant: KABUSHIKI KAISHA TOSHIBA, Minato-ku (JP)

(72) Inventors: Katsuhisa Tanaka, Tsukuba (JP); Shinya Kyogoku, Yokohama (JP); Ryosuke Iijima, Setagaya (JP); Shinichi Kimoto, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/797,633

(22) Filed: Feb. 21, 2020

(65) Prior Publication Data
US 2021/0083100 A1    Mar. 18, 2021

(30) Foreign Application Priority Data
Sep. 13, 2019   (JP) ............................. JP2019-167646

(51) Int. Cl.
*H01L 29/78*    (2006.01)
*H01L 21/04*    (2006.01)
(Continued)

(52) U.S. Cl.
CPC ........ *H01L 29/7813* (2013.01); *H01L 21/047* (2013.01); *H01L 29/1608* (2013.01); *H01L 29/66068* (2013.01)

(58) Field of Classification Search
CPC ............... H01L 21/047; H01L 29/7813; H01L 29/1608; H01L 29/66068
(Continued)

(56) References Cited

U.S. PATENT DOCUMENTS

| 6,495,871 B2 | 12/2002 | Hattori et al. |
| 8,193,564 B2 | 6/2012 | Suzuki et al. |
(Continued)

FOREIGN PATENT DOCUMENTS

| JP | 2001-250947 A | 9/2001 |
| JP | 2010-147228 A | 7/2010 |
(Continued)

OTHER PUBLICATIONS

Yusuke Kobayashi, et al., "Low on-resistance SiC trench MOSFET with suppressed short channel effect by halo implantation", International Conference on Silicon Carbide and Related Materials, ICSCRM 2017, 2 pages.

*Primary Examiner* — Igwe U Anya
(74) *Attorney, Agent, or Firm* — Oblon, McClelland, Maier & Neustadt, L.L.P.

(57) ABSTRACT

A semiconductor device according to an embodiment includes: a SiC layer having a first plane, a second plane, a first trench located on a first plane side, an n-type first SiC region, a p-type second SiC region between the first SiC region and the first plane, an n-type third SiC region between the second SiC region and the first plane, and a p-type fourth SiC region between the first SiC region and the first plane, at least a portion of the fourth SiC region located in the second SiC region, the fourth SiC region having a higher p-type impurity concentration than the second SiC region; a gate electrode in the first trench; a first electrode located on the first plane side; and a second electrode located on a second plane side. A depth of the fourth SiC region increases with distance from the first trench.

20 Claims, 30 Drawing Sheets

(51) Int. Cl.
*H01L 29/66* (2006.01)
*H01L 29/16* (2006.01)

(58) Field of Classification Search
USPC .......................................................... 257/77
See application file for complete search history.

(56) References Cited

U.S. PATENT DOCUMENTS

| | | | |
|---|---|---|---|
| 9,741,797 | B2 | 8/2017 | Kagawa et al. |
| 2012/0261676 | A1* | 10/2012 | Nakano ............. H01L 29/41741 257/77 |
| 2013/0306983 | A1* | 11/2013 | Nakano ............... H01L 29/0696 257/76 |
| 2017/0309711 | A1 | 10/2017 | Kagawa et al. |
| 2018/0025910 | A1* | 1/2018 | Ohashi ................ H01L 29/1095 257/77 |
| 2018/0097079 | A1 | 4/2018 | Utsumi et al. |

FOREIGN PATENT DOCUMENTS

| | | |
|---|---|---|
| JP | 2018-60923 A | 4/2018 |
| JP | 2018-182335 A | 11/2018 |
| JP | 2019-050352 A | 3/2019 |

\* cited by examiner

US 11,069,803 B2

SEMICONDUCTOR DEVICE, METHOD OF MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-167646, filed on Sep. 13, 2019, the entire contents of which are incorporated herein by reference.

FIELD

Embodiments described herein relate generally to a semiconductor device, a method of manufacturing a semiconductor device, an inverter circuit, a driving device, a vehicle, and an elevator.

BACKGROUND

Silicon carbide (SiC) is expected as a material for next-generation semiconductor devices. The silicon carbide has excellent physical properties such as a band gap of about 3 times, a breakdown field strength of about 10 times, and a thermal conductivity of about 3 times as compared with silicon. By utilizing these physical properties, it is possible to realize a semiconductor device capable of operating at a low loss and at a high temperature.

In a vertical-type metal oxide semiconductor field effect transistor (MOSFET), a trench gate structure in which a gate electrode is provided in a trench is applied in order to realize a low on-resistance. By applying the trench gate structure, the channel area per unit area increases, and the on-resistance is reduced. It can be expected that the on-resistance is further reduced by shortening the channel length.

DETAILED DESCRIPTION

Figure 1:
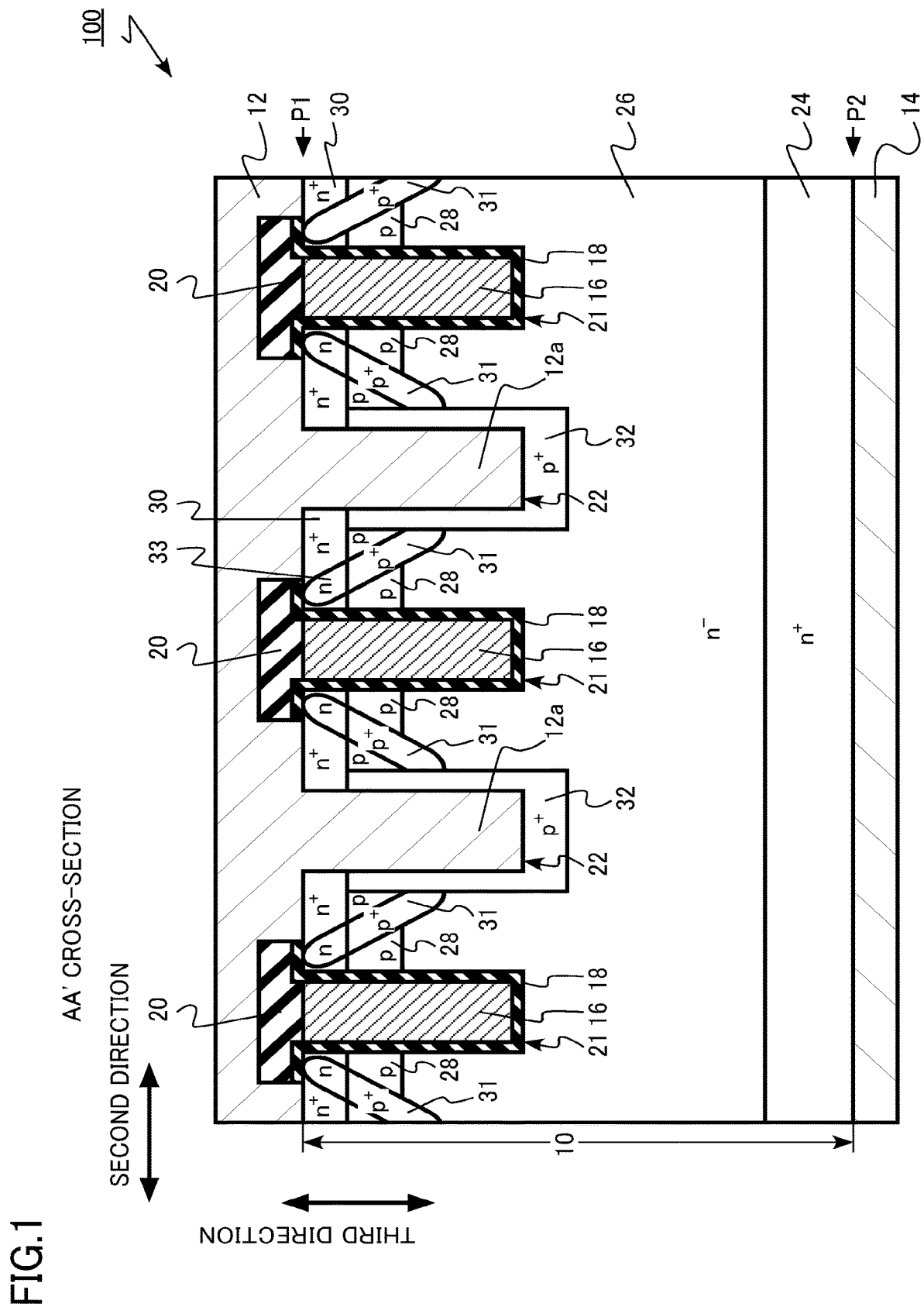
FIG. 1 is a schematic cross-sectional view of a semiconductor device according to a first embodiment.

A semiconductor device according to an embodiment includes: a silicon carbide layer having a first plane parallel to a first direction and a second direction perpendicular to the first direction and a second plane facing the first plane, the silicon carbide layer having a first trench being located on a side of the first plane and extending in the first direction, a first silicon carbide region of n-type, a second silicon carbide region of p-type being located between the first silicon carbide region and the first plane, a third silicon carbide region of n-type being located between the second silicon carbide region and the first plane, and a fourth silicon carbide region of p-type being located between the first silicon carbide region and the first plane, at least a portion of the fourth silicon carbide region being located in the second silicon carbide region, the fourth silicon carbide region having a higher p-type impurity concentration than a p-type impurity concentration of the second silicon carbide region; a gate electrode being located in the first trench; a gate insulating layer being located between the gate electrode and the silicon carbide layer; a first electrode being located on a side of the first plane of the silicon carbide layer; and a second electrode being located on a side of the second plane of the silicon carbide layer, wherein a first position and a second position exist in the at least portion of the fourth silicon carbide region, a first distance from the first plane to the first position is smaller than a second distance from the first plane to the second position, and a third distance from the gate insulating layer to the first position is smaller than a fourth distance from the gate insulating layer to the second position.

Hereinafter, embodiments will be described with reference to the drawings. In addition, in the following description, the same or similar members are denoted by the same reference numerals, and the description of the members or the like that have been described once is omitted as appropriate.

In addition, in the following description, the notations $n^+$, n, $n^-$ and $p^+$, p, $p^-$ represent the relative levels of the impurity concentrations in the respective conductivity types. That is, $n^+$ represents to be relatively higher in the n-type impurity concentration than n, and $n^-$ represents to be relatively lower in the n-type impurity concentration than n. In addition, $p^+$ represents to be relatively higher in the p-type impurity concentration than p, and $p^-$ represents to be relatively lower in the p-type impurity concentration than p. In addition, in some cases, the $n^+$-type and the $n^-$-type may be simply referred to as the n-type and the $p^+$-type and $p^-$-type may be simply referred to as the p-type.

The impurity concentration can be measured by, for example, secondary ion mass spectrometry (SIMS). In addition, the relative level of the impurity concentration can be determined from the level of the carrier concentration obtained by, for example, scanning capacitance microscopy (SCM). In addition, the distance such as the width and depth of the impurity region can be obtained by, for example, SIMS. In addition, the distance such as the width and depth of the impurity region can be obtained from, for example, an SCM image.

The depth of the trench, the thickness of the insulating layer, and the like can be measured on images of, for example, a transmission electron microscope (TEM). In addition, for example, the depth of the trench, the thickness of the insulating layer, and the like can be determined from a SIMS profile.

In this specification, the "p-type impurity concentration" of the p-type silicon carbide region denotes a net p-type impurity concentration obtained by subtracting the n-type impurity concentration of the region from the p-type impurity concentration of the region. In addition, the "n-type impurity concentration" of the n-type silicon carbide region denotes a net n-type impurity concentration obtained by subtracting the p-type impurity concentration of the region from the n-type impurity concentration of the region.

First Embodiment

A semiconductor device according to a first embodiment includes: a silicon carbide layer having a first plane parallel to a first direction and a second direction perpendicular to the first direction and a second plane facing the first plane, the silicon carbide layer having a first trench being located on a side of the first plane and extending in the first direction, a first silicon carbide region of n-type, a second silicon carbide region of p-type being located between the first silicon carbide region and the first plane, a third silicon carbide region of n-type being located between the second silicon carbide region and the first plane, and a fourth silicon carbide region of p-type being located between the first silicon carbide region and the first plane, at least a portion of the fourth silicon carbide region being located in the second silicon carbide region, the fourth silicon carbide region having a higher p-type impurity concentration than a p-type impurity concentration of the second silicon carbide region; a gate electrode being located in the first trench; a gate insulating layer being located between the gate electrode and the silicon carbide layer; a first electrode being located on a side of the first plane of the silicon carbide layer; and a second electrode being located on a side of the second plane of the silicon carbide layer. A first position and a second position exist in the at least portion of the fourth silicon carbide region, a first distance from the first plane to the first position is smaller than a second distance from the first plane to the second position, and a third distance from the gate insulating layer to the first position is smaller than a fourth distance from the gate insulating layer to the second position.

The semiconductor device according to the first embodiment is a vertical-type MOSFET 100 using silicon carbide. The MOSFET 100 is a MOSFET having a trench gate structure in which a gate electrode is provided in a trench. The MOSFET 100 is a MOSFET having a so-called double trench structure in which a source electrode is provided in a trench. The MOSFET 100 is an n-channel MOSFET using electrons as carriers.

Figure 2:
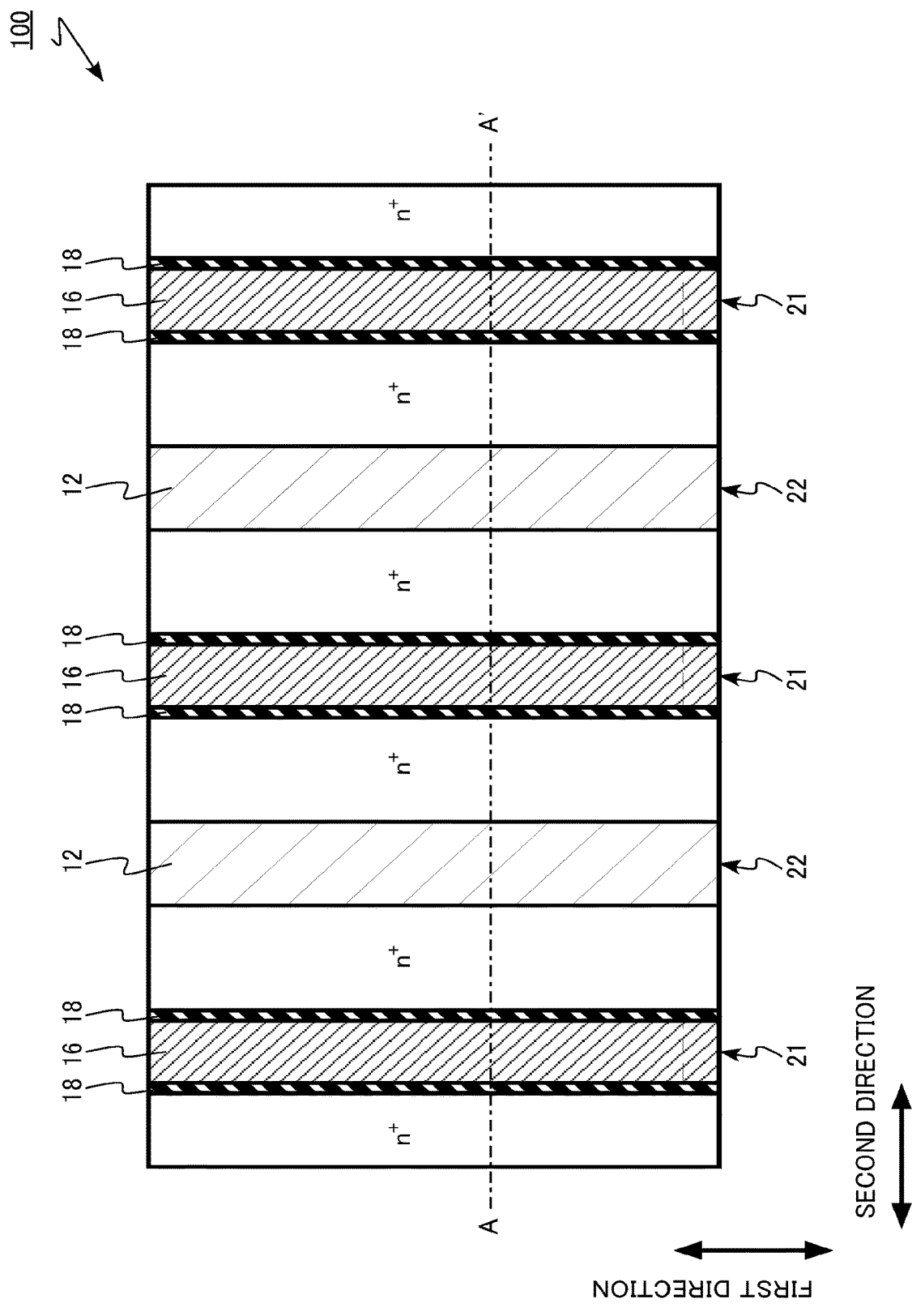
FIG. 2 is a schematic plan view of the semiconductor device according to the first embodiment.
Figure 3:
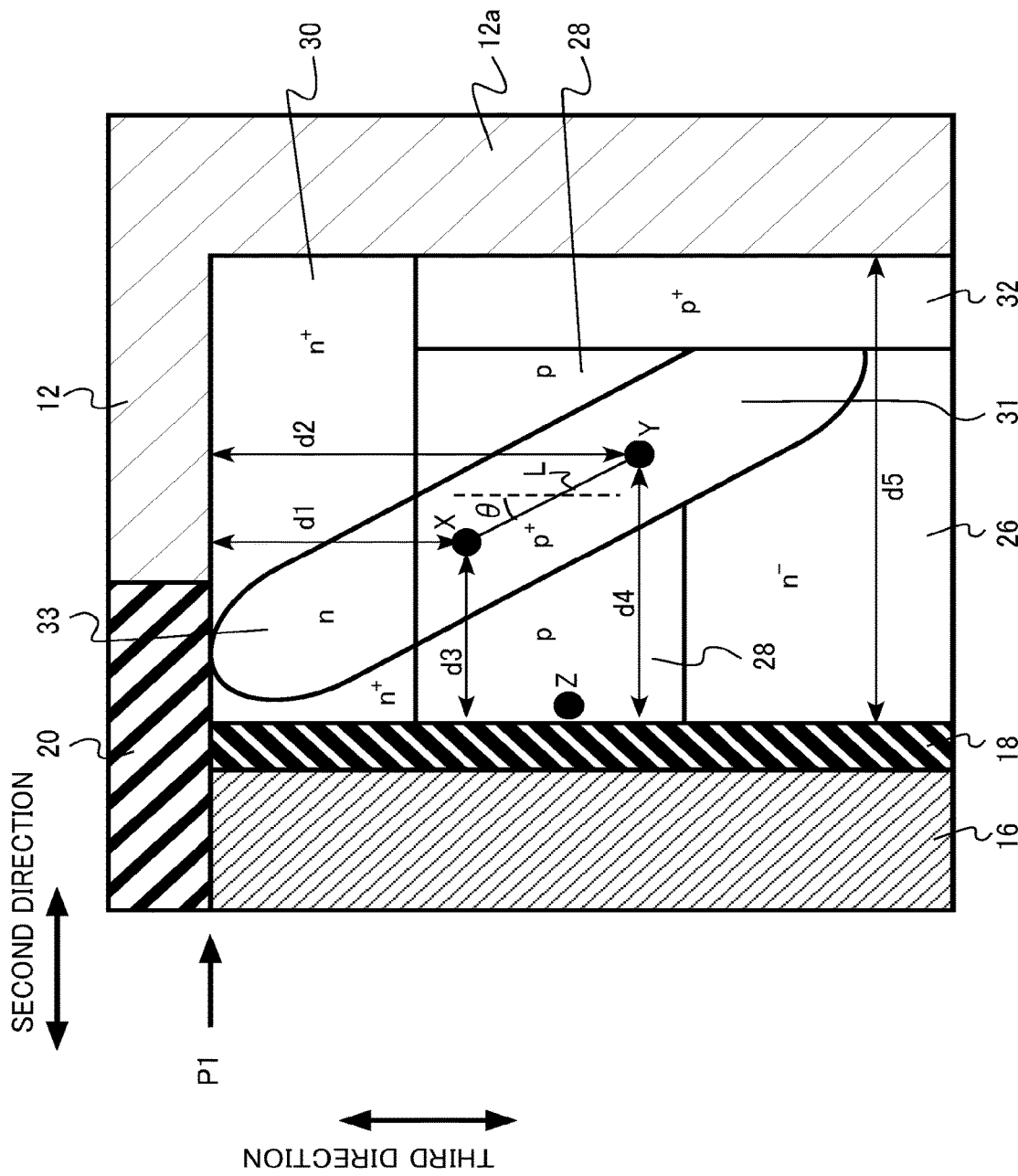
FIG. 3 is an enlarged schematic cross-sectional view of the semiconductor device according to the first embodiment.

FIG. 1 is a schematic cross-sectional view of the semiconductor device according to the first embodiment. FIG. 2 is a schematic plan view of the semiconductor device according to the first embodiment. FIG. 3 is an enlarged schematic cross-sectional view of the semiconductor device according to the first embodiment.

FIG. 1 is an AA' cross-sectional view of FIG. 2. FIG. 2 illustrates a pattern on the first plane P1 of FIG. 1. FIG. 3 is an enlarged view of a portion of FIG. 1.

The MOSFET 100 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 includes a gate trench 21 (first trench), a contact trench 22 (second trench), an $n^+$-type drain region 24, an $n^-$-type drift region 26 (first silicon carbide region), a p-type body region 28 (second silicon carbide region), an $n^+$-type source region 30 (third silicon carbide region), a $p^+$-type high concentration region 31 (fourth silicon carbide region), a $p^+$-type electric field relaxation region 32 (sixth silicon carbide region), and an n-type high resistance region 33 (fifth silicon carbide region).

The silicon carbide layer 10 is located between the source electrode 12 and the drain electrode 14. The silicon carbide layer 10 has a first plane ("P1" in FIG. 1) and a second plane ("P2" in FIG. 1). Hereinafter, the first plane P1 is also referred to as a front surface, and the second plane P2 is also referred to as a back surface. The second plane P2 faces the first plane P1.

The first direction and the second direction are directions parallel to the first plane P1. The second direction is a direction perpendicular to the first direction. In addition, the third direction is a direction perpendicular to the first plane. The third direction is a direction perpendicular to the first direction and the second direction.

Hereinafter, "depth" denotes a depth based on the first plane P1.

The silicon carbide layer 10 is single crystal SiC. The silicon carbide layer 10 is, for example, 4H—SiC. The silicon carbide layer 10 has a thickness of, for example, 5 µm or more and 500 µm or less.

The first plane P1 is, for example, a plane inclined at 0 degree or more and 8 degrees or less with respect to the (0001) face. That is, the first plane P1 is a plane of which normal line is inclined at 0 degree or more and 8 degrees or less with respect to the c-axis in the [0001] direction. In other words, the off angle with respect to the (0001) face is 0 degree or more and 8 degrees or less. In addition, the second plane P2 is, for example, a plane inclined at 0 degree or more and 8 degrees or less with respect to the (000-1) face.

The (0001) face is called a silicon face. The (000-1) face is called a carbon face. The inclination direction of the first plane P1 and the second plane P2 is, for example, the [11-20] direction. The [11-20] direction is the a-axis direction. In FIGS. 1 and 2, for example, the first direction or the second direction illustrated in the figures is the a-axis direction.

The gate trench 21 exists in the silicon carbide layer 10. The gate trench 21 is located on the side of the silicon carbide layer 10 closer to the first plane P1. The gate trench 21 is a groove formed in the silicon carbide layer 10.

The gate trench 21 extends in the first direction as illustrated in FIG. 2. The gate trench 21 has a stripe shape as illustrated in FIG. 2.

The gate trenches 21 are repeatedly arranged in the second direction as illustrated in FIGS. 1 and 2. The depth of the gate trench 21 is, for example, 1 µm or more and 2 µm or less. The width of the gate trench 21 in the second direction is, for example, 0.5 µm or more and 1 µm or less.

The gate trench 21 penetrates the source region 30 and the body region 28.

The contact trench 22 exists in the silicon carbide layer 10. The contact trench 22 is located on the side of the silicon carbide layer 10 closer to the first plane P1. The contact trench 22 is a groove formed in the silicon carbide layer 10.

The contact trench 22 extends in the first direction as illustrated in FIG. 2. The contact trench 22 has a stripe shape as illustrated in FIG. 2.

The contact trenches 22 are repeatedly arranged in the second direction as illustrated in FIGS. 1 and 2, and the depth of the contact trench 22 is, for example, 1 µm or more and 2 µm or less. The width of the contact trench 22 in the second direction is, for example, 0.5 µm or more and 1 µm or less.

The contact trench 22 penetrates the source region 30 and the body region 28.

The contact trench 22 is provided between the two gate trenches 21. The width of the contact trench 22 in the second direction and the width of the gate trench 21 in the second direction are, for example, equal.

The depth of the contact trench 22 and the depth of the gate trench 21 are, for example, equal. In other words, the distance from the second plane P2 to the gate trench 21 is equal to the distance from the second plane P2 to the contact trench 22.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is located between the gate electrode 16 and the silicon carbide layer 10. The gate insulating layer 18 is provided between the source region 30 and the gate electrode 16, between the body region 28 and the gate electrode 16, and between the drift region 26 and the gate electrode 16.

The gate insulating layer 18 is, for example, a silicon oxide film. For example, a high dielectric constant insulating film can be applied to the gate insulating layer 18. In addition, for example, a stacked film of a silicon oxide film and a high dielectric constant insulating film can be applied to the gate insulating layer 18.

The interlayer insulating layer 20 is provided on the gate electrode 16. The interlayer insulating layer 20 is provided between the gate electrode 16 and the source electrode 12.

For example, the thickness of the interlayer insulating layer 20 is larger than the thickness of the gate insulating layer 18. The interlayer insulating layer 20 is, for example, a silicon oxide film. The interlayer insulating layer 20 electrically separates the gate electrode 16 and the source electrode 12.

The source electrode 12 is located on side of the silicon carbide layer 10 closer to the first plane P1. The source electrode 12 is provided on the first plane P1 of the silicon carbide layer 10. The source electrode 12 is in contact with the source region 30 and the electric field relaxation region 32.

The source electrode 12 is in contact with the source region 30 on the first plane P1 of the silicon carbide layer 10.

The contact region 12a that is a portion of the source electrode 12 is located in the contact trench 22. The contact region 12a is in contact with the source region 30 on the side surface of the contact trench 22. The contact region 12a is in contact with the electric field relaxation region 32 on the side and bottom surfaces of the contact trench 22.

The source electrode 12 contains a metal. The metal forming the source electrode 12 has, for example, a stacked structure of titanium (Ti) and aluminum (Al). The source electrode 12 may contain, for example, metal silicide or metal carbide in contact with the silicon carbide layer 10.

The drain electrode 14 is located on the side of the silicon carbide layer 10 closer to the second plane P2. The drain electrode 14 is provided on the second plane P2 of the silicon carbide layer 10. The drain electrode 14 is in contact with the drain region 24.

The drain electrode 14 is, for example, a metal or a metal semiconductor compound. The drain electrode 14 contains, for example, a material selected from the group consisting of nickel silicide (NiSi), titanium (Ti), nickel (Ni), silver (Ag), and gold (Au).

The $n^+$-type drain region 24 is provided on the side of the silicon carbide layer 10 closer to the second plane P2. The drain region 24 contains, for example, nitrogen (N) as an n-type impurity. The n-type impurity concentration of the drain region 24 is, for example, $1×10^{18}$ cm$^{-3}$ or more and $1×10^{21}$ cm$^{-3}$ or less.

The n$^-$-type drift region 26 is provided on the drain region 24. The drift region 26 is located between the first plane P1 and the drain region 24.

The drift region 26 contains, for example, nitrogen (N) as an n-type impurity. The n-type impurity concentration of the drift region 26 is lower than the n-type impurity concentration of the drain region 24. The n-type impurity concentration of the drift region 26 is, for example, $4×10^{14}$ cm$^{-3}$ or more and $1×10^{18}$ cm$^{-3}$ or less.

The p-type body region 28 is located between the drift region 26 and the first plane P1. The body region 28 is located between the gate trench 21 and the contact trench 22.

The body region 28 functions as a channel formation region of the MOSFET 100. For example, during the time of on-operation of the MOSFET 100, a channel through which electrons flow is formed in a region of the body region 28 in contact with the gate insulating layer 18. The region of the body region 28 in contact with the gate insulating layer 18 becomes a channel formation region.

The body region 28 contains, for example, aluminum (Al) as a p-type impurity. The p-type impurity concentration of the body region 28 is, for example, $5×10^{16}$ cm$^{-3}$ or more and $5×10^{17}$ cm$^{-3}$ or less.

The depth of the body region 28 is smaller than the depth of the gate trench 21. The depth of the body region 28 is, for example, 0.4 μm or more and 1.0 μm or less.

The thickness of the body region 28 in the depth direction (third direction) is, for example, 0.1 μm or more and 0.3 μm or less.

The n$^+$-type source region 30 is located between the body region 28 and the first plane P1. The source region 30 is located between the gate trench 21 and the contact trench 22.

The source region 30 is in contact with the source electrode 12. The source region 30 is in contact with the gate insulating layer 18.

The source region 30 contains, for example, phosphorus (P) as an n-type impurity. The source region 30 has an n-type impurity concentration higher than the drift region 26. The n-type impurity concentration of the source region 30 is, for example, $1×10^{19}$ cm$^{-3}$ or more and $1×10^{21}$ cm$^{-3}$ or less.

The depth of the source region 30 is smaller than the depth of the body region 28. The depth of the source region 30 is, for example, 0.1 μm or more and 0.4 μm or less.

The p$^+$-type electric field relaxation region 32 is located between the contact trench 22 and the drift region 26. The electric field relaxation region 32 is in contact with the bottom surface of the contact trench 22. The electric field relaxation region 32 is in contact with the contact region 12a of the source electrode 12.

The electric field relaxation region 32 is located between the contact trench 22 and the body region 28. The electric field relaxation region 32 is in contact with the side surface of the contact trench 22.

The electric field relaxation region 32 has a function of relaxing the electric field applied to the gate insulating layer 18 at the time of off-operation of the MOSFET 100. The electric field relaxation region 32 is fixed at, for example, the same potential as the source electrode 12.

The electric field relaxation region 32 contains, for example, aluminum (Al) as a p-type impurity. The p-type impurity concentration of the electric field relaxation region 32 is higher than the p-type impurity concentration of the body region 28. The p-type impurity concentration of the electric field relaxation region 32 is, for example, ten times or more of the p-type impurity concentration of the body region 28. The p-type impurity concentration of the electric field relaxation region 32 is, for example, $5×10^{17}$ cm$^{-3}$ or more and $5×10^{20}$ cm$^{-3}$ or less.

The p$^+$-type high concentration region 31 is located between the drift region 26 and the first plane P1. At least a portion of the high concentration region 31 is located in the body region 28. The high concentration region 31 is located between gate trench 21 and the contact trench 22.

A portion of the body region 28 is located between the gate insulating layer 18 and the high concentration region 31. The high concentration region 31 is not in contact with, for example, the gate insulating layer 18. The high concentration region 31 is provided, for example, at a position away from the gate insulating layer 18 in the second direction.

The p$^+$-type high concentration region 31 has, for example, a function of suppressing the short channel effect of the MOSFET 100. The high concentration region 31 has, for example, a function of suppressing a decrease in breakdown voltage of the MOSFET 100.

The high concentration region 31 contains, for example, aluminum (Al) as a p-type impurity. The p-type impurity concentration of the high concentration region 31 is higher than the p-type impurity concentration of the body region 28. The p-type impurity concentration of the high concentration region 31 is, for example, $1×10^{16}$ cm$^{-3}$ or more and $5×10^{19}$ cm$^{-3}$ or less.

As illustrated in FIG. 3, a first position (X in FIG. 3) and a second position (Y in FIG. 3) exist in the high concentration region 31 in the body region 28. A first distance (d1 in FIG. 3) from the first plane P1 to the first position X is smaller than a second distance (d2 in FIG. 3) from the first plane P1 to the second position Y, and a third distance (d3 in FIG. 3) from the gate insulating layer 18 to the first position X is smaller than a fourth distance (d4 in FIG. 3) from the gate insulating layer 18 to the second position Y. The high concentration region 31 becomes deeper from the gate trench 21 toward the contact trench 22 in the body region 28.

Figure 4:
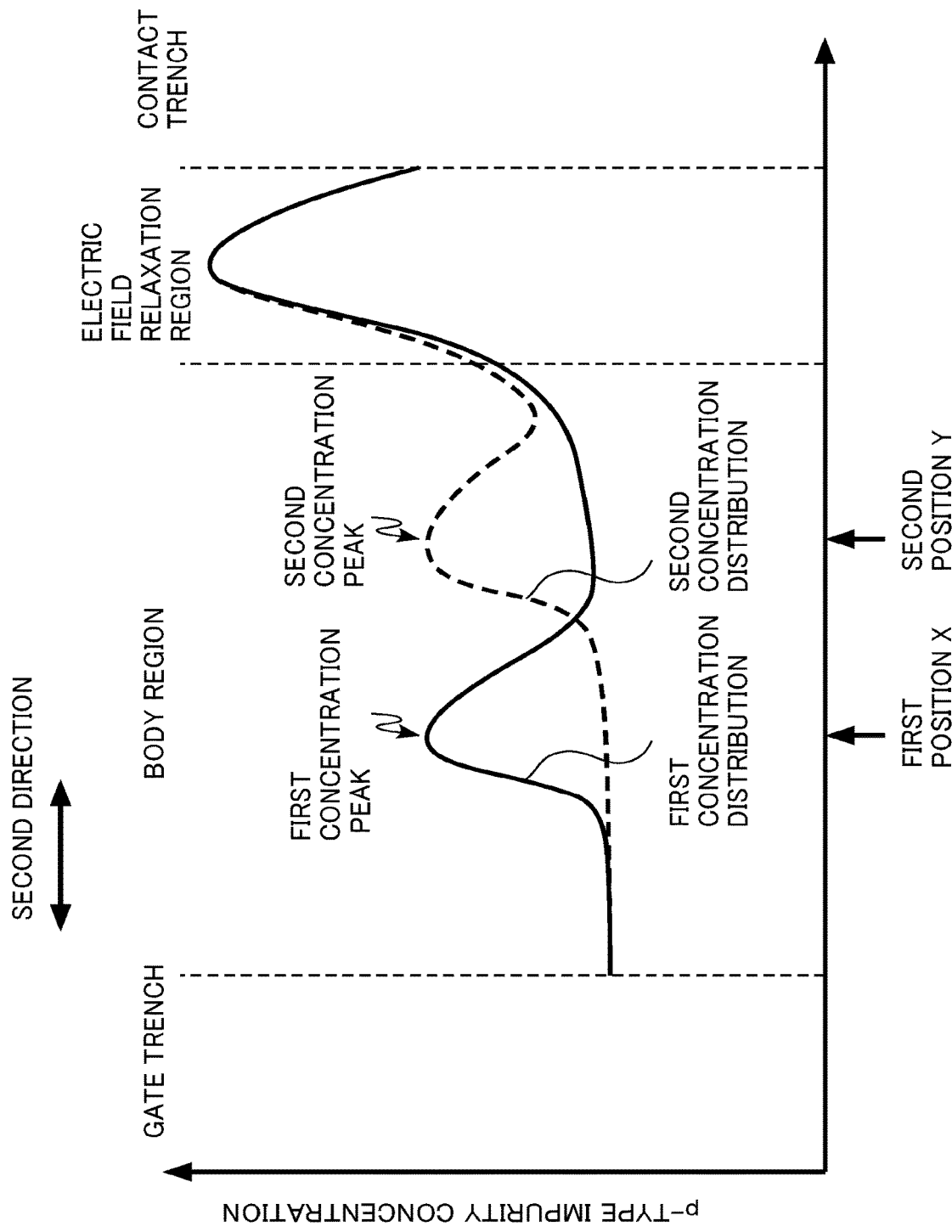
FIG. 4 is a view illustrating an impurity concentration distribution of the semiconductor device according to the first embodiment.

FIG. 4 is a view illustrating an impurity concentration distribution of the semiconductor device according to the first embodiment. FIG. 4 illustrates the concentration distribution of the p-type impurity in the body region 28 in the second direction.

As illustrated in FIG. 4, the first concentration distribution of the p-type impurity on the first virtual line including the first position X of the high concentration region 31 and extending in the second direction has a first concentration peak at the first position X. In addition, as illustrated in FIG. 4, the second concentration distribution of the p-type impurity on the second virtual line including the second position Y and extending in the second direction has a second concentration peak at the second position Y.

In addition, on the first virtual line and the second virtual line, other concentration peaks different from the first concentration peak and the second concentration peak also exist in the electric field relaxation region 32 between the gate trench 21 and the contact trench 22, respectively.

The angle (θ in FIG. 3) of the segment (L in FIG. 3) connecting the first position X and the second position Y with respect to the normal line (dotted line in FIG. 3) of the first plane P1 is 20 degrees or more and 50 degrees or less. In other words, the high concentration region 31 is inclined from 20 degrees or more to 50 degrees or less with respect to the third direction.

The inclination of the high concentration region 31 in the third direction is larger than the inclination of the side surface of the contact trench 22 in the third direction.

The third distance d3 is, for example, 0.05 µm or more and 0.4 µm or less, and the fourth distance d4 is, for example, 0.1 µm or more and 0.5 µm or less. The third distance d3 is, for example, half or less of the distance (d5 in FIG. 3) between the gate insulating layer 18 and the contact trench 22.

The p-type impurity concentration at the first position X and the p-type impurity concentration at the second position Y are, for example, 2 times or more and 100 times or less of the p-type impurity concentration near the gate insulating layer 18 (for example, the position Z in FIG. 3) in the body region 28. The vicinity of the gate insulating layer 18 in the body region 28 is, for example, a position less than 0.05 µm from the gate insulating layer 18.

The high concentration region 31 is in contact with, for example, the drift region 26. A portion of the high concentration region 31 is located, for example, in the drift region 26.

The high concentration region 31 is in contact with, for example, the electric field relaxation region 32.

The high concentration region 31 is in contact with, for example, the source region 30.

The n-type high resistance region 33 is located in the source region 30. The high resistance region 33 is located between the high concentration region 31 and the first plane P1.

The high resistance region 33 has, for example, a function of improving the short-circuit withstand capability of the MOSFET 100.

The high resistance region 33 contains, for example, phosphorus (P) as an n-type impurity. The n-type impurity concentration of the high resistance region 33 is lower than the n-type impurity concentration of the source region 30. The n-type impurity concentration of the high resistance region 33 is, for example, $1\times10^{18}$ cm$^{-3}$ or more and $1\times10^{20}$ cm$^{-3}$ or less.

The high resistance region 33 is in contact with, for example, the first plane P1. The high resistance region 33 is in contact with, for example, the high concentration region 31.

Next, an example of the method of manufacturing the semiconductor device according to the first embodiment will be described.

A method of manufacturing the semiconductor device according to the first embodiment includes: forming a second silicon carbide region of p-type on a side of a first plane of a silicon carbide layer, the silicon carbide layer having a first plane, a second plane facing the first plane, and a first silicon carbide region of n-type located between the second plane and the first plane; forming a third silicon carbide region of n-type between the second silicon carbide region and the first plane; forming a mask material having an opening on aside of the first plane of the silicon carbide layer; forming a fourth silicon carbide region of p-type by ion-implanting p-type impurities into the silicon carbide layer in a direction inclined at a first angle with respect to a normal line of the first plane by using the mask material as a mask, at least a portion of the fourth silicon carbide region being located in the second silicon carbide region; forming a first trench on aside of the first plane of the silicon carbide layer; forming a gate insulating layer in the first trench; and forming a gate electrode on the gate insulating layer in the first trench. A first position and a second position exist in the at least a portion of the fourth silicon carbide region, a first distance from the first plane to the first position is smaller than a second distance from the first plane to the second position, and a third distance from the gate insulating layer to the first position is smaller than a fourth distance from the gate insulating layer to the second position.

FIGS. 5, 6, 7, 8, 9, 10, 11, 12, 13, 14, 15, 16, 17, 18, and 19 are schematic cross-sectional views illustrating an example of the method of manufacturing the semiconductor device according to the first embodiment. FIGS. 5, 6, 7, 8, 9, 10, 11, 12, 13, 14, 15, 16, 17, 18, and 19 illustrate cross-sections corresponding to FIG. 1.

Figure 5:
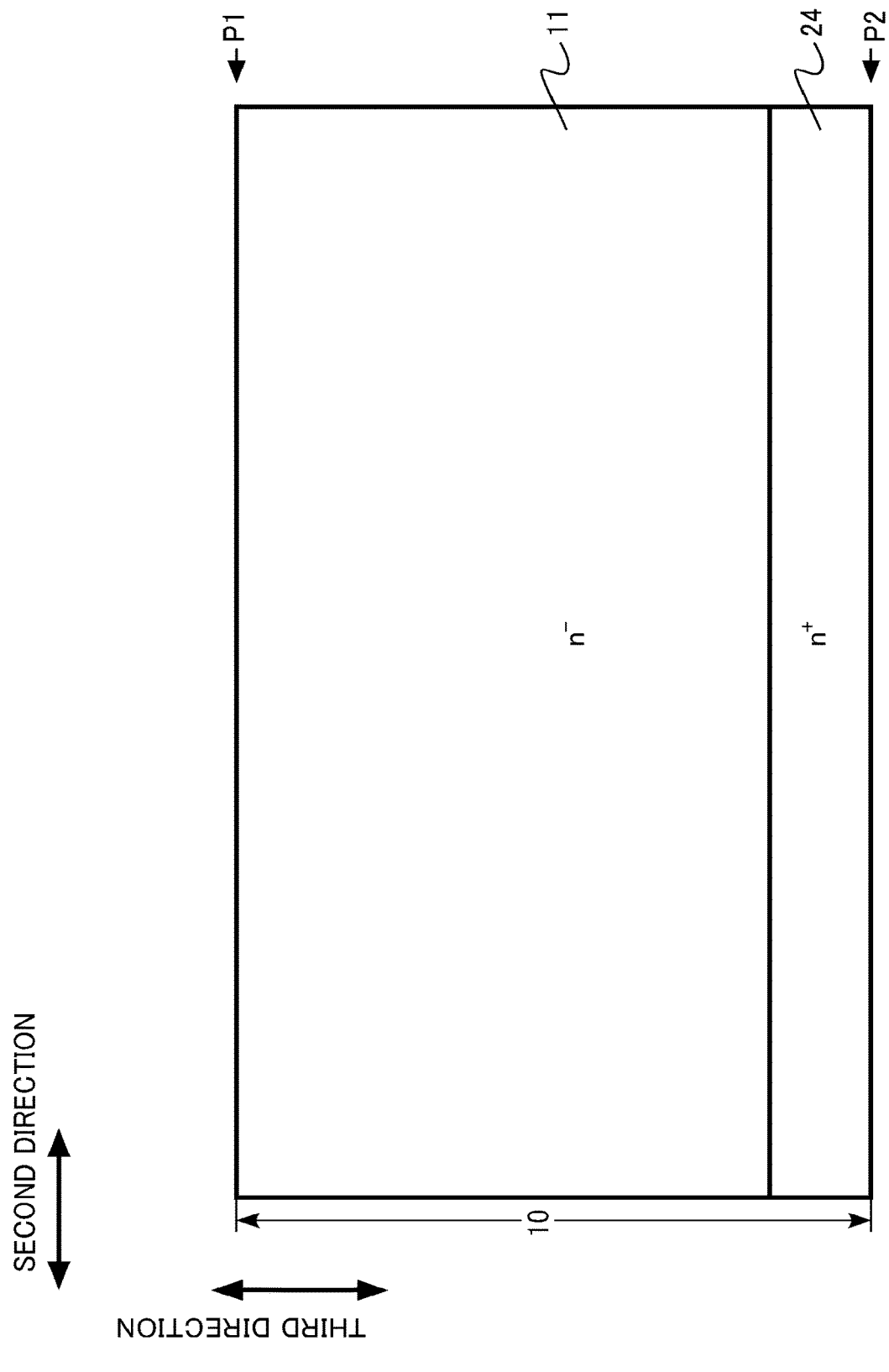
FIG. 5 is a schematic cross-sectional view illustrating an example of a method of manufacturing the semiconductor device according to the first embodiment.

First, a silicon carbide layer 10 having an n$^+$-type drain region 24 and an n$^-$-type epitaxial layer 11 formed on the drain region 24 by epitaxial growth is prepared (FIG. 5). A portion of the epitaxial layer 11 eventually becomes the drift region 26.

The silicon carbide layer 10 has a first plane ("P1" in FIG. 5) and a second plane ("P2" in FIG. 5). Hereinafter, the first plane P1 is also referred to as a front surface, and the second plane P2 is also referred to as a back surface.

Figure 6:
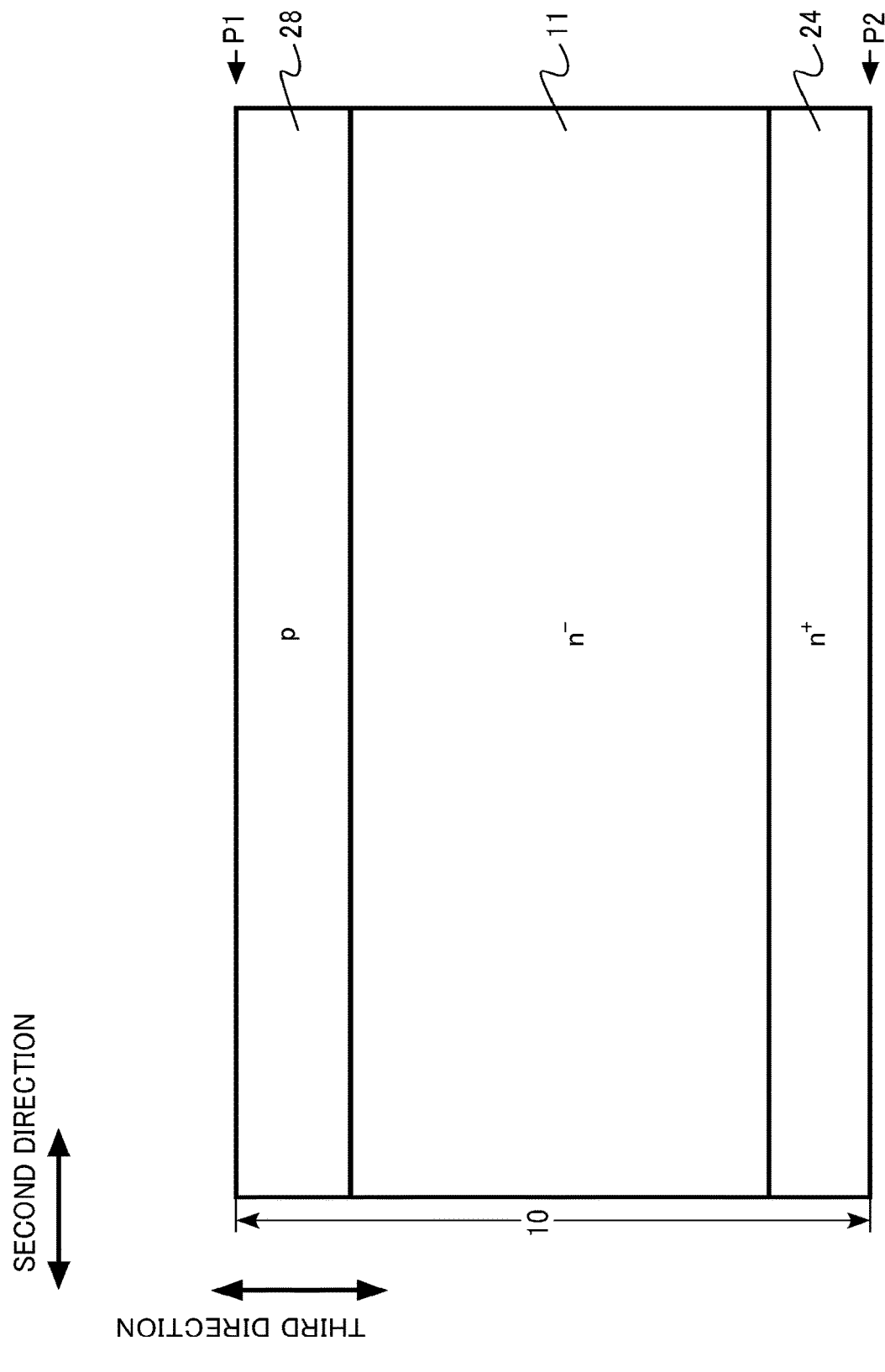
FIG. 6 is a schematic cross-sectional view illustrating an example of the method of manufacturing the semiconductor device according to the first embodiment.

Next, a p-type body region 28 is formed in the epitaxial layer 11 by an ion implantation method (FIG. 6).

Figure 7:
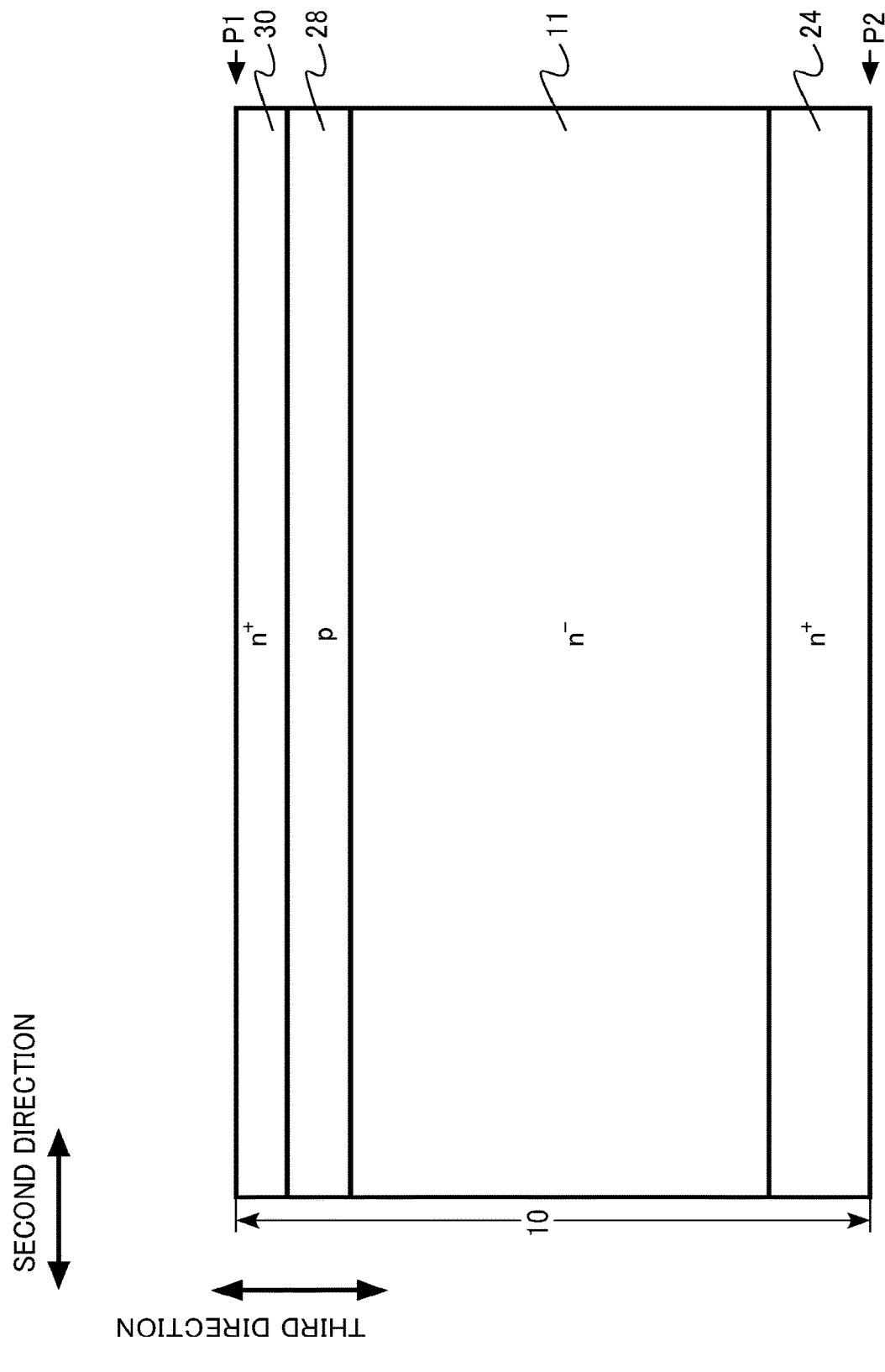
FIG. 7 is a schematic cross-sectional view illustrating an example of the method of manufacturing the semiconductor device according to the first embodiment.

Next, an n$^+$-type source region 30 is formed in the epitaxial layer 11 by an ion implantation method (FIG. 7). The source region 30 is formed between the body region 28 and the first plane P1.

Figure 8:
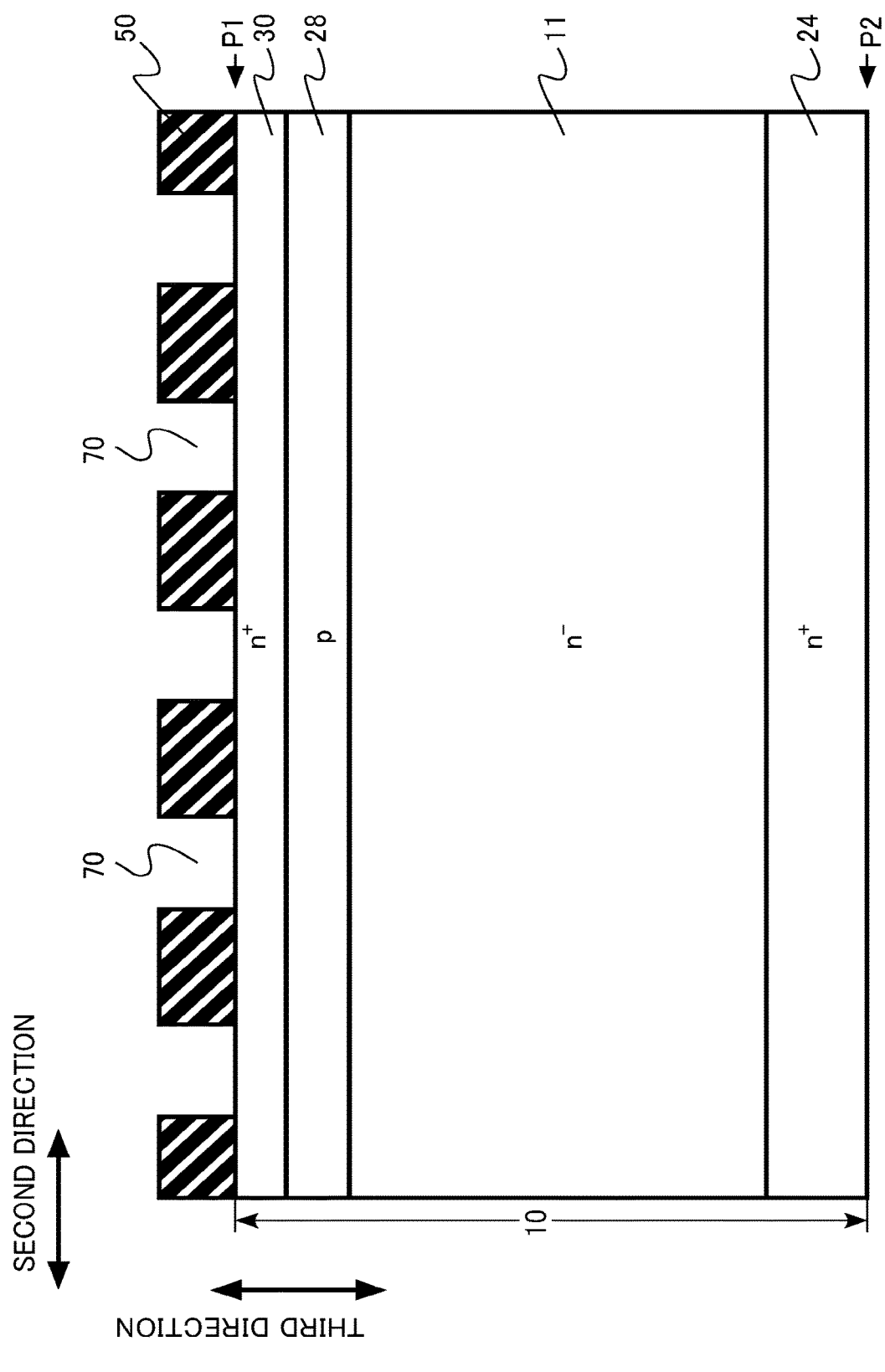
FIG. 8 is a schematic cross-sectional view illustrating an example of the method of manufacturing the semiconductor device according to the first embodiment.

Next, a mask material 50 is formed on the front surface of the silicon carbide layer 10 (FIG. 8). The mask material 50 has an opening 70. The mask material 50 is formed, for example, by depositing a film by a chemical vapor deposition method (CVD method) and patterning the film by using a lithography method and a reactive ion etching method (RIE method). The mask material 50 is, for example, a silicon oxide film.

Figure 9:
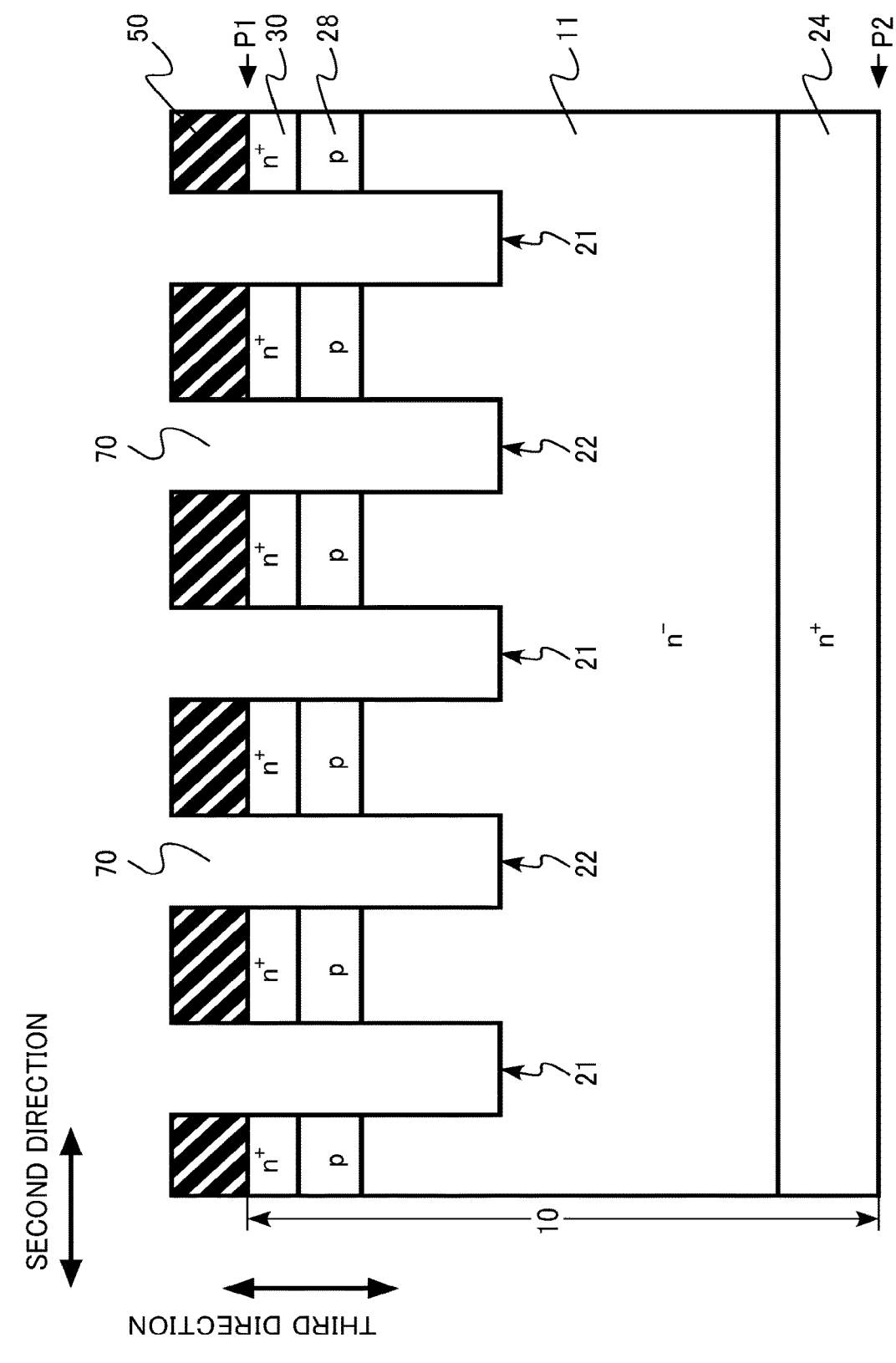
FIG. 9 is a schematic cross-sectional view illustrating an example of the method of manufacturing the semiconductor device according to the first embodiment.

Next, a gate trench 21 (first trench) and a contact trench 22 (second trench) are formed by using the mask material 50 as a mask (FIG. 9). The gate trench 21 and the contact trench 22 are formed by using an RIE method. The gate trench 21 and the contact trench 22 are formed so as to penetrate the source region 30 and the body region 28. The contact trench 22 is formed in the silicon carbide layer 10 below the opening 70 of the mask material 50.

Figure 10:
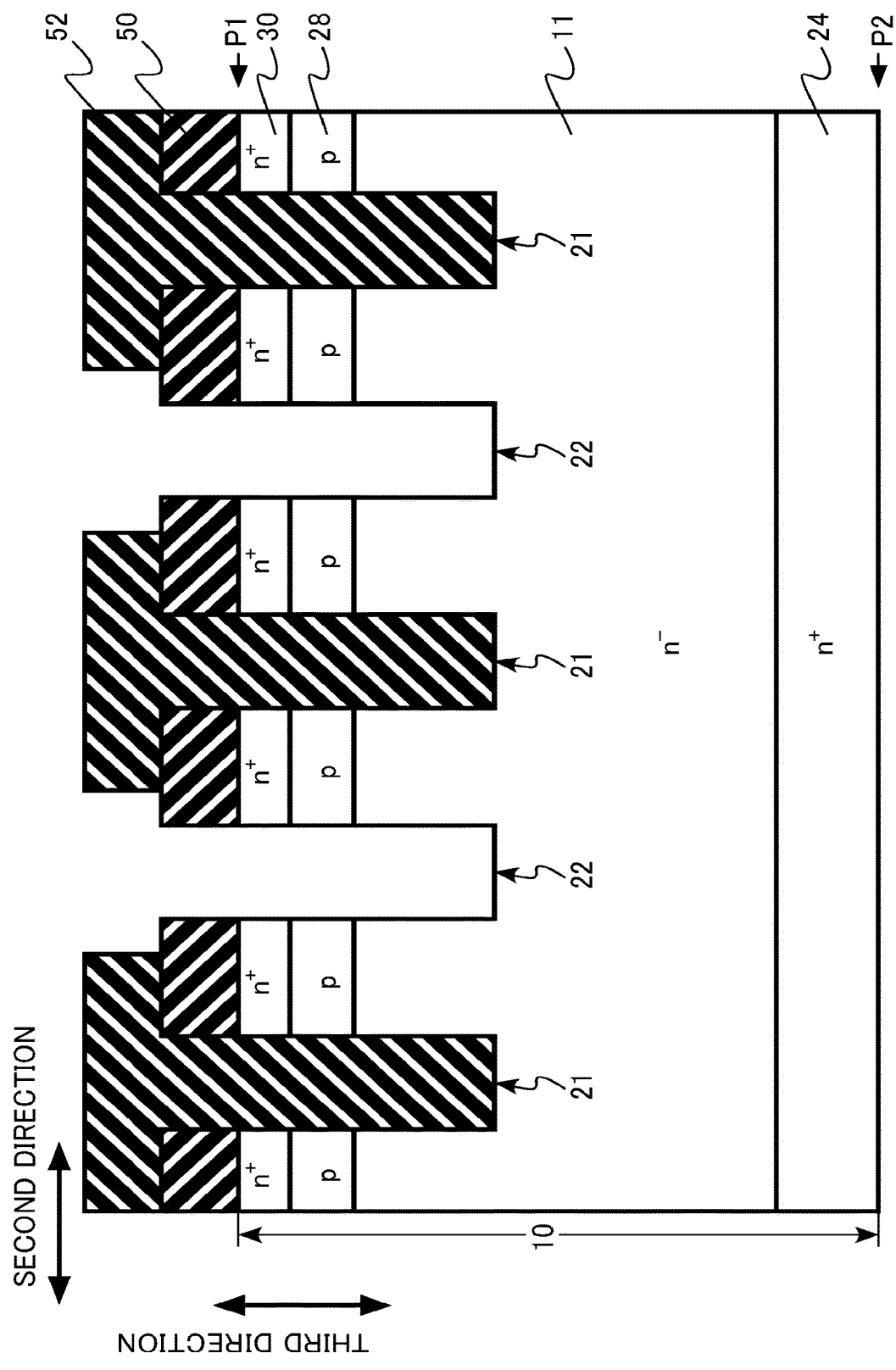
FIG. 10 is a schematic cross-sectional view illustrating an example of the method of manufacturing the semiconductor device according to the first embodiment.

Next, a mask material 52 is formed on the silicon carbide layer 10 (FIG. 10). The mask material 52 covers the mask material 50 and the gate trench 21. The mask material 52 is, for example, a photoresist.

Figure 11:
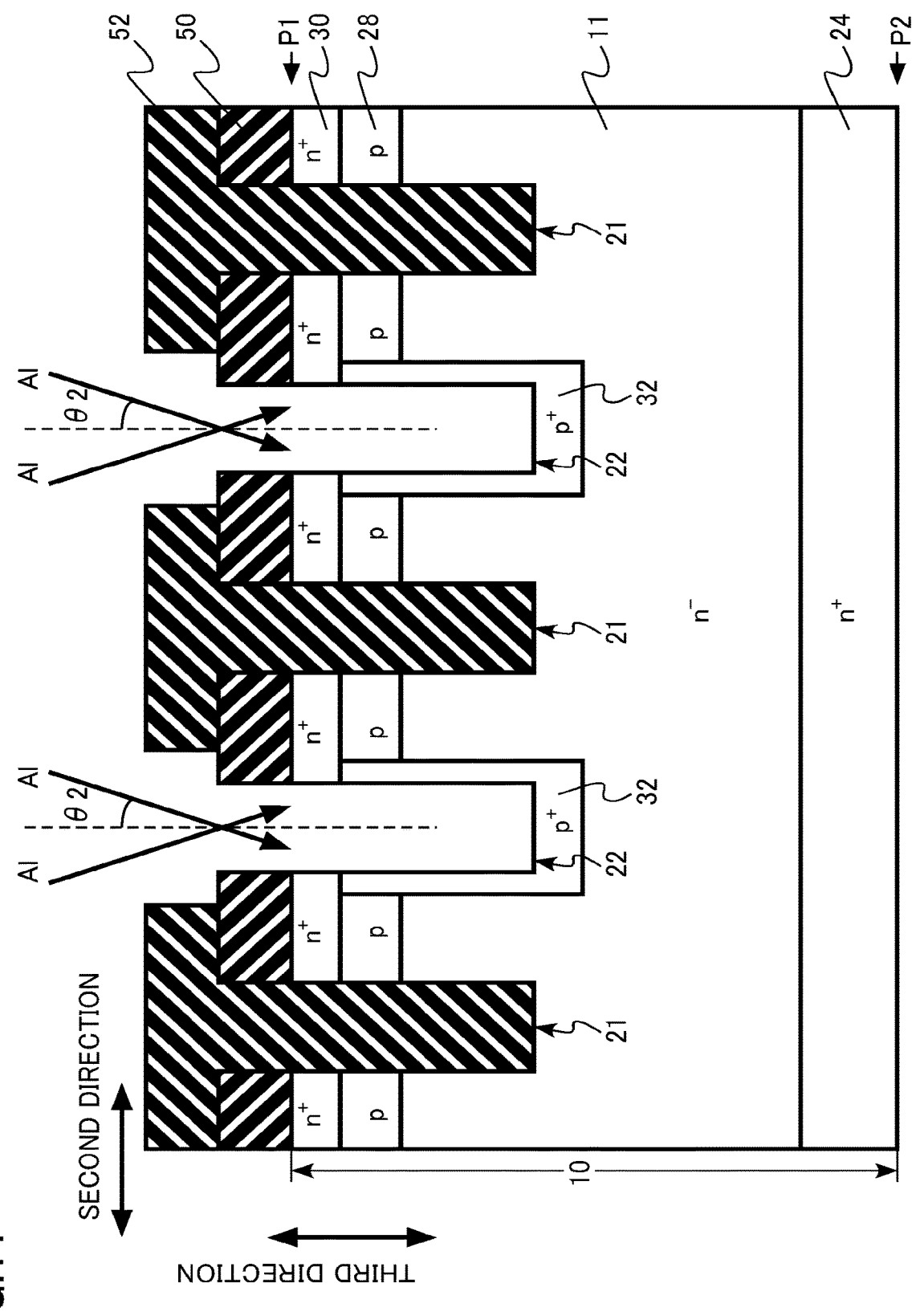
FIG. 11 is a schematic cross-sectional view illustrating an example of the method of manufacturing the semiconductor device according to the first embodiment.

Next, a p$^+$-type electric field relaxation region 32 is formed (FIG. 11). The electric field relaxation region 32 is formed by implanting p-type impurities into the contact trench 22 by oblique ion implantation method by using the mask material 52 and the mask material 50 as a mask. The p-type impurity is, for example, an aluminum ion. Aluminum ions are ion-implanted in a direction inclined at a second angle (θ2 in FIG. 11) with respect to a normal line (dotted line in FIG. 11) of the first plane P1. The p$^+$-type electric field relaxation region 32 is formed near the side and bottom surfaces of the contact trench 22 in the silicon carbide layer 10.

Figure 12:
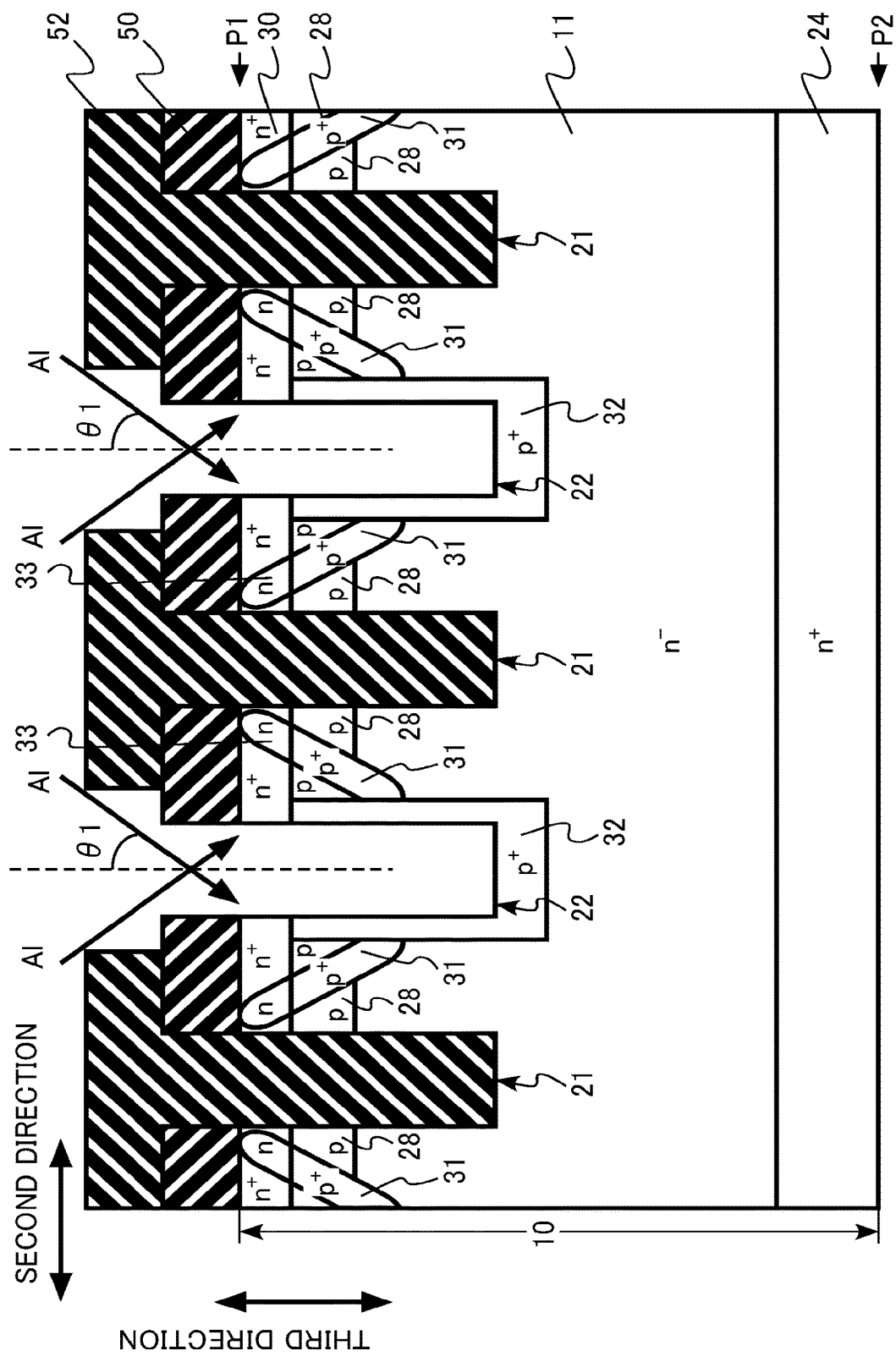
FIG. 12 is a schematic cross-sectional view illustrating an example of the method of manufacturing the semiconductor device according to the first embodiment.

Next, a p$^+$-type high concentration region 31 is formed (FIG. 12). The high concentration region 31 is formed by implanting p-type impurities into the contact trench 22 by oblique ion implantation method by using the mask material 52 and the mask material 50 as a mask. The p-type impurity is, for example, an aluminum ion. Aluminum ions are ion-implanted in a direction inclined at a first angle (θ1 in FIG. 12) with respect to a normal line (dotted line in FIG. 12) of the first plane P1.

The first angle θ1 is larger than the second angle θ2. In other words, the second angle θ2 is smaller than the first angle θ1.

A portion of the p-type impurities ion-implanted into the contact trench 22 is implanted into the side surface of the contact trench 22 after losing kinetic energy due to passing through the mask material 52 and the mask material 50. Therefore, the depth of the high concentration region 31 increases from the gate trench 21 toward the contact trench 22.

An n-type high resistance region 33 is formed simultaneously with the high concentration region 31. The high resistance region 33 is formed in the source region 30. By introducing the p-type impurities into the source region 30, the n-type impurity concentration is reduced, and thus, the high resistance region 33 with a low n-type impurity concentration is formed.

Figure 13:
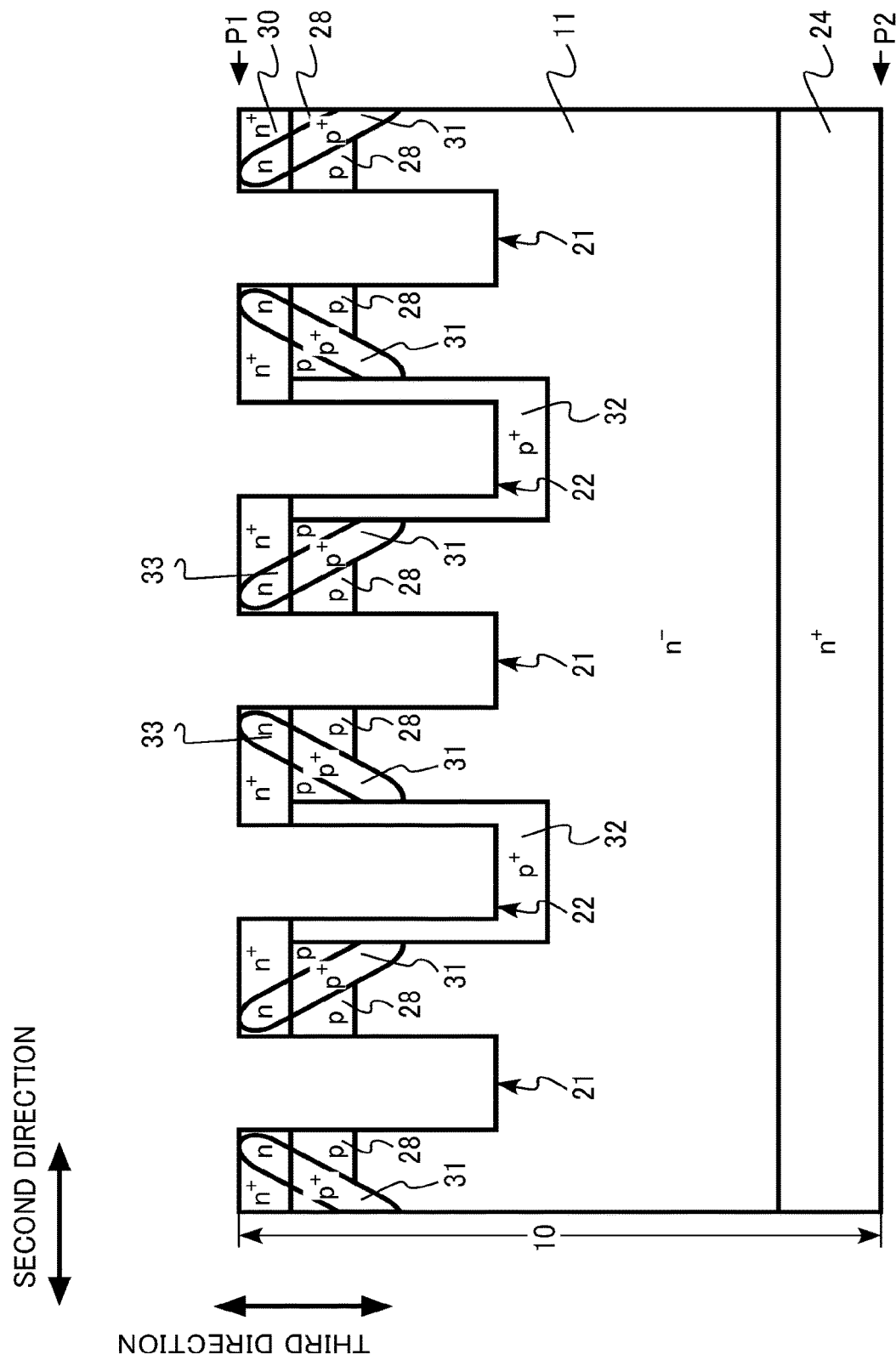
FIG. 13 is a schematic cross-sectional view illustrating an example of the method of manufacturing the semiconductor device according to the first embodiment.

Next, the mask material 52 and the mask material 50 are peeled off (FIG. 13). Next, activation annealing of an n-type impurity and a p-type impurity is performed.

Figure 14:
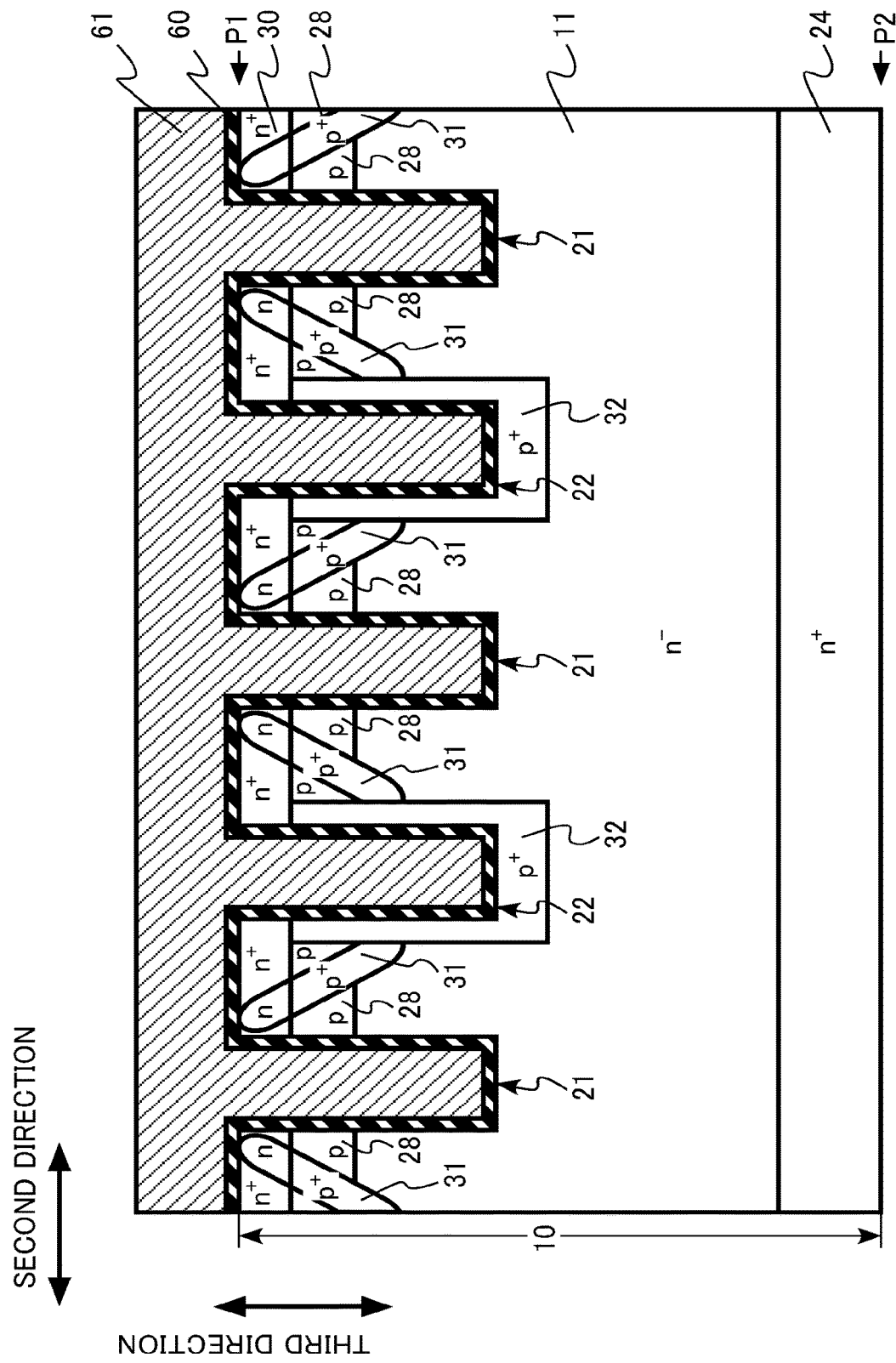
FIG. 14 is a schematic cross-sectional view illustrating an example of the method of manufacturing the semiconductor device according to the first embodiment.

Next, a first silicon oxide film 60 and a polycrystalline silicon film 61 are formed in the gate trench 21 and the contact trench 22 (FIG. 14).

The first silicon oxide film 60 and the polycrystalline silicon film 61 are formed by, for example, a CVD method. A portion of the first silicon oxide film 60 becomes the gate insulating layer 18. A portion of the polycrystalline silicon film 61 becomes the gate electrode 16.

Figure 15:
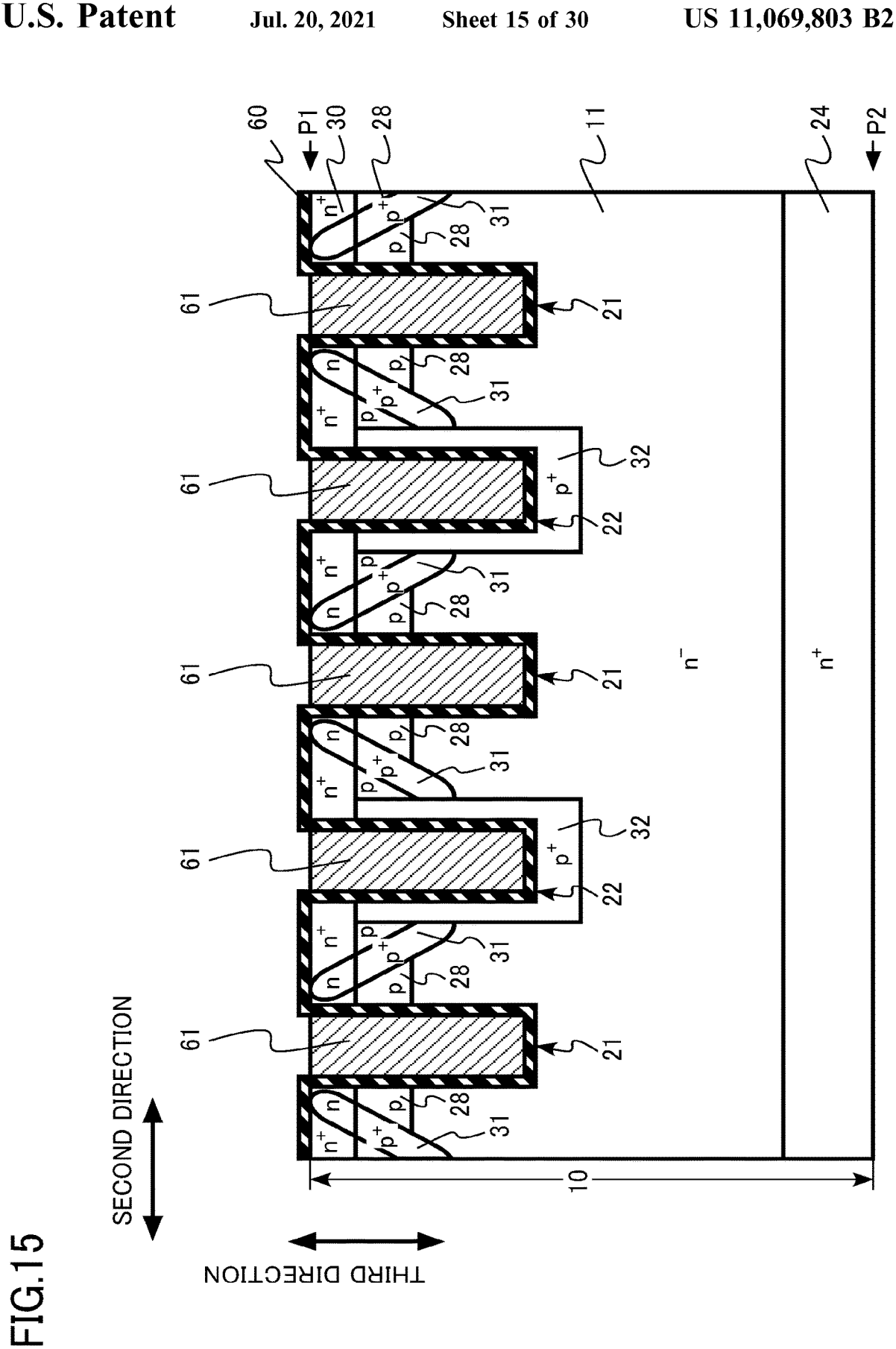
FIG. 15 is a schematic cross-sectional view illustrating an example of the method of manufacturing the semiconductor device according to the first embodiment.

Next, the polycrystalline silicon film 61 on the front surface of the silicon carbide layer 10 is removed (FIG. 15). The polycrystalline silicon film 61 on the front surface of the silicon carbide layer 10 is removed by, for example, a dry etching method. A portion of the polycrystalline silicon film 61 remains in the gate trench 21 and the contact trench 22.

Next, a mask material 54 is formed on the front surface of the silicon carbide layer 10. The mask material 54 is, for example, a photoresist.

The mask material 54 covers the gate trench 21. The mask material 54 covers the polycrystalline silicon film 61 in the gate trench 21.

Figure 16:
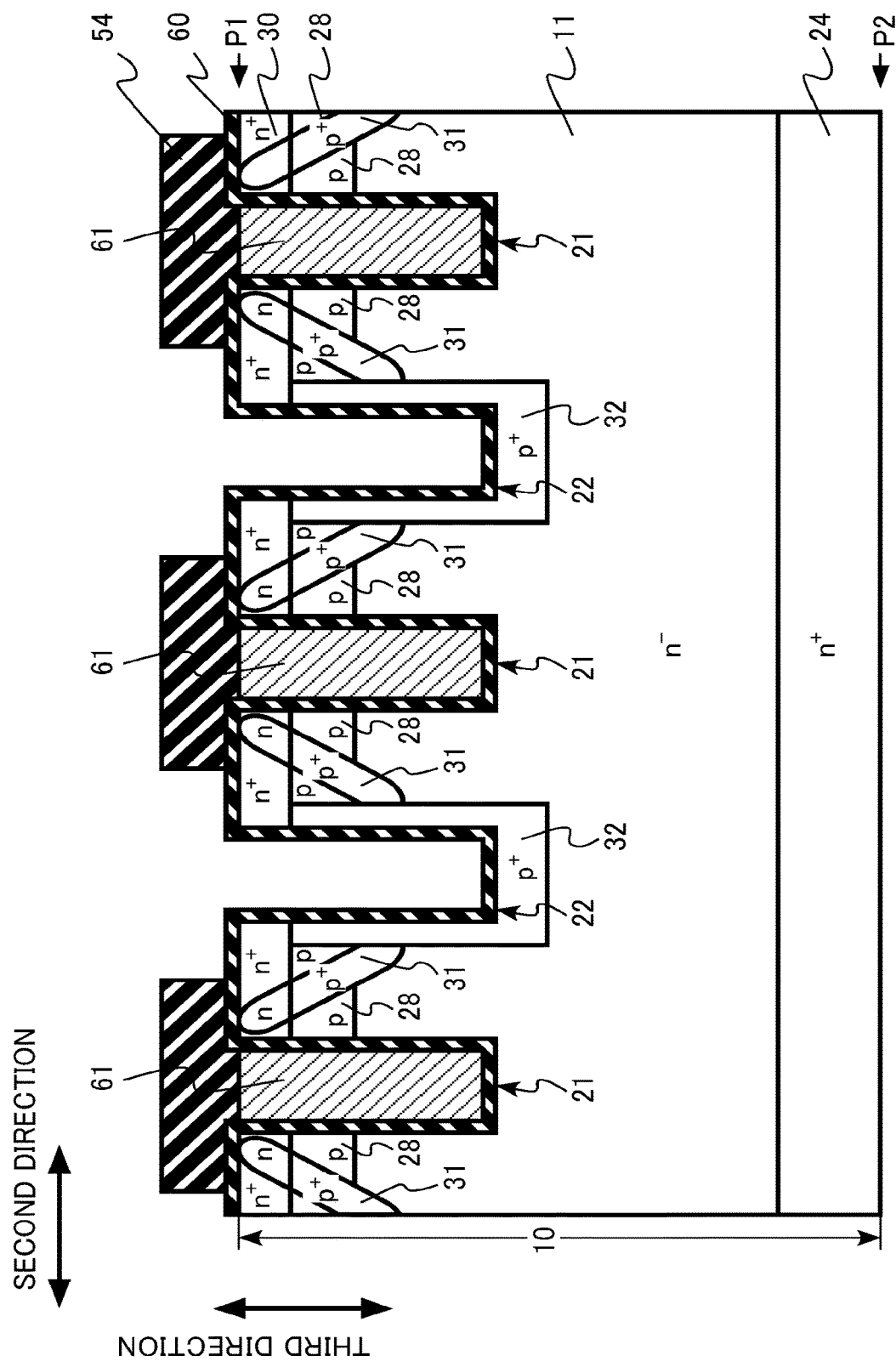
FIG. 16 is a schematic cross-sectional view illustrating an example of the method of manufacturing the semiconductor device according to the first embodiment.

Next, the polycrystalline silicon film 61 in the contact trench 22 is removed by using the mask material 54 as a mask (FIG. 16). The polycrystalline silicon film 61 is removed by, for example, a dry etching method.

Figure 17:
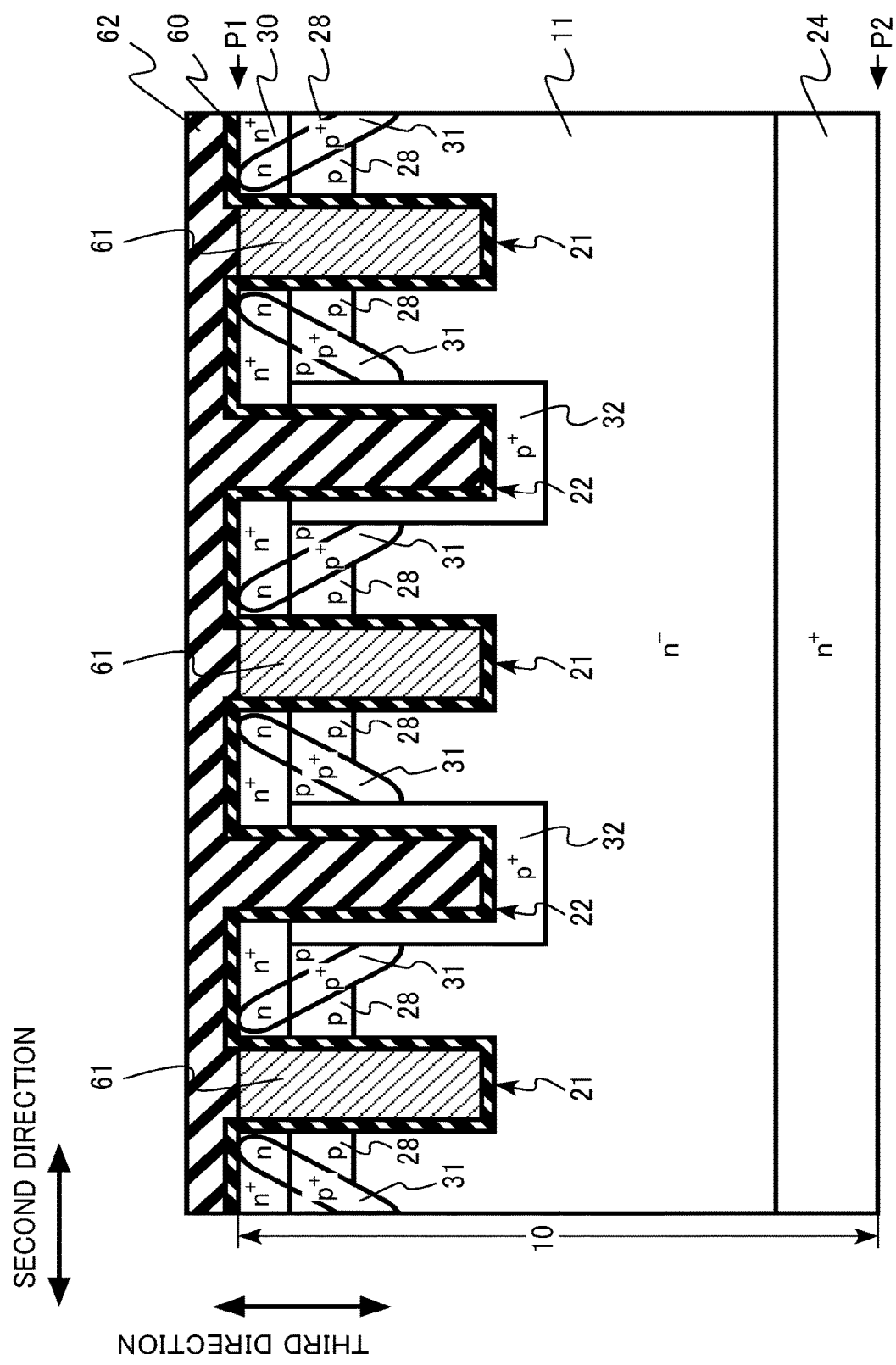
FIG. 17 is a schematic cross-sectional view illustrating an example of the method of manufacturing the semiconductor device according to the first embodiment.

Next, the mask material 54 is removed. Next, a second silicon oxide film 62 is formed on the first silicon oxide film 60 and the polycrystalline silicon film 61 (FIG. 17). The second silicon oxide film 62 is formed by, for example, a CVD method. A portion of the second silicon oxide film 62 becomes the interlayer insulating layer 20.

Next, a mask material 56 is formed on the second silicon oxide film 62. The mask material 56 is, for example, a photoresist.

Figure 18:
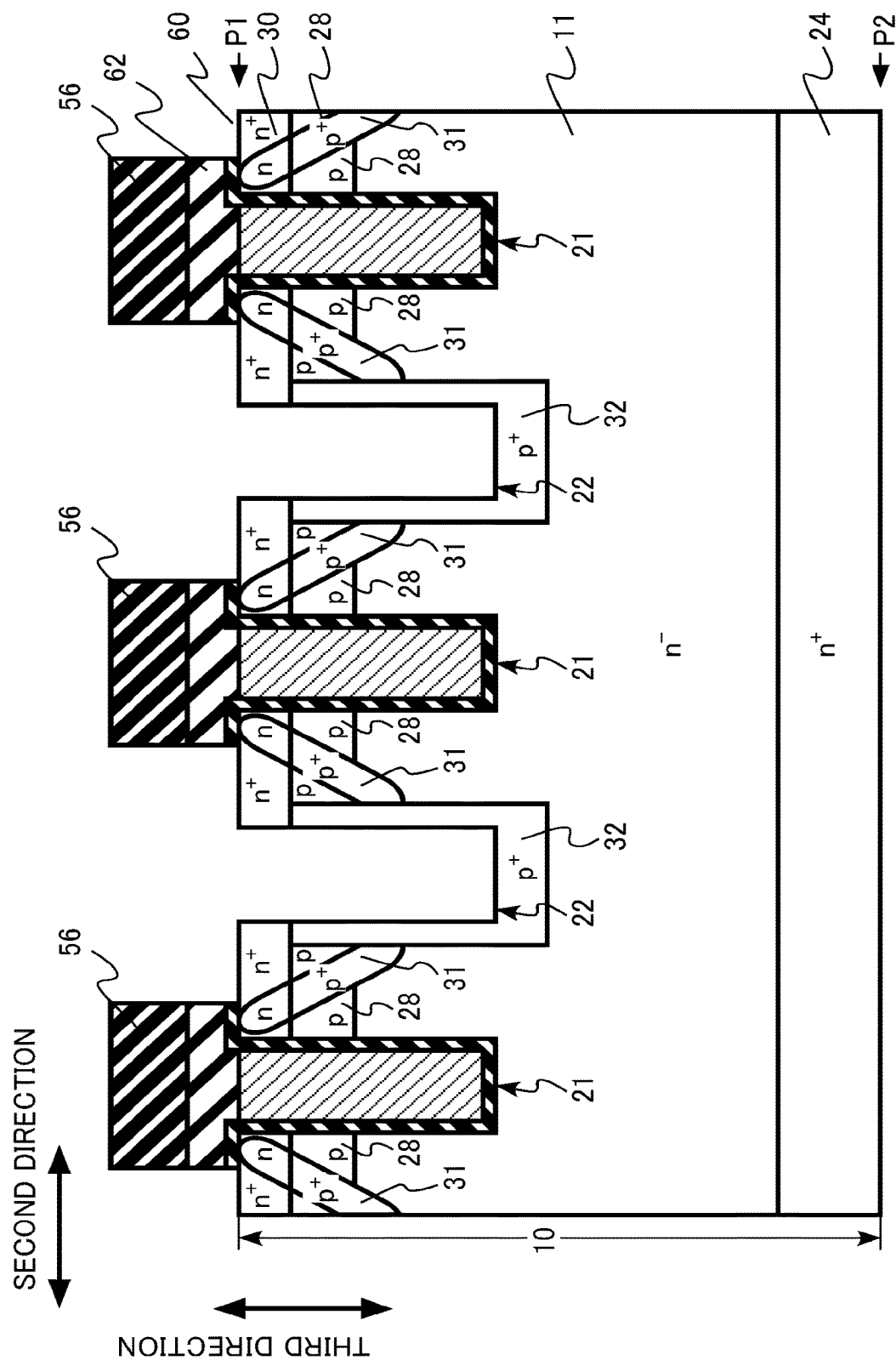
FIG. 18 is a schematic cross-sectional view illustrating an example of the method of manufacturing the semiconductor device according to the first embodiment.

Next, the first silicon oxide film 60 and the second silicon oxide film 62 in the contact trench 22 are removed by using the mask material 56 as a mask (FIG. 18). The first silicon oxide film 60 and the second silicon oxide film 62 are removed by, for example, a wet etching method.

Figure 19:
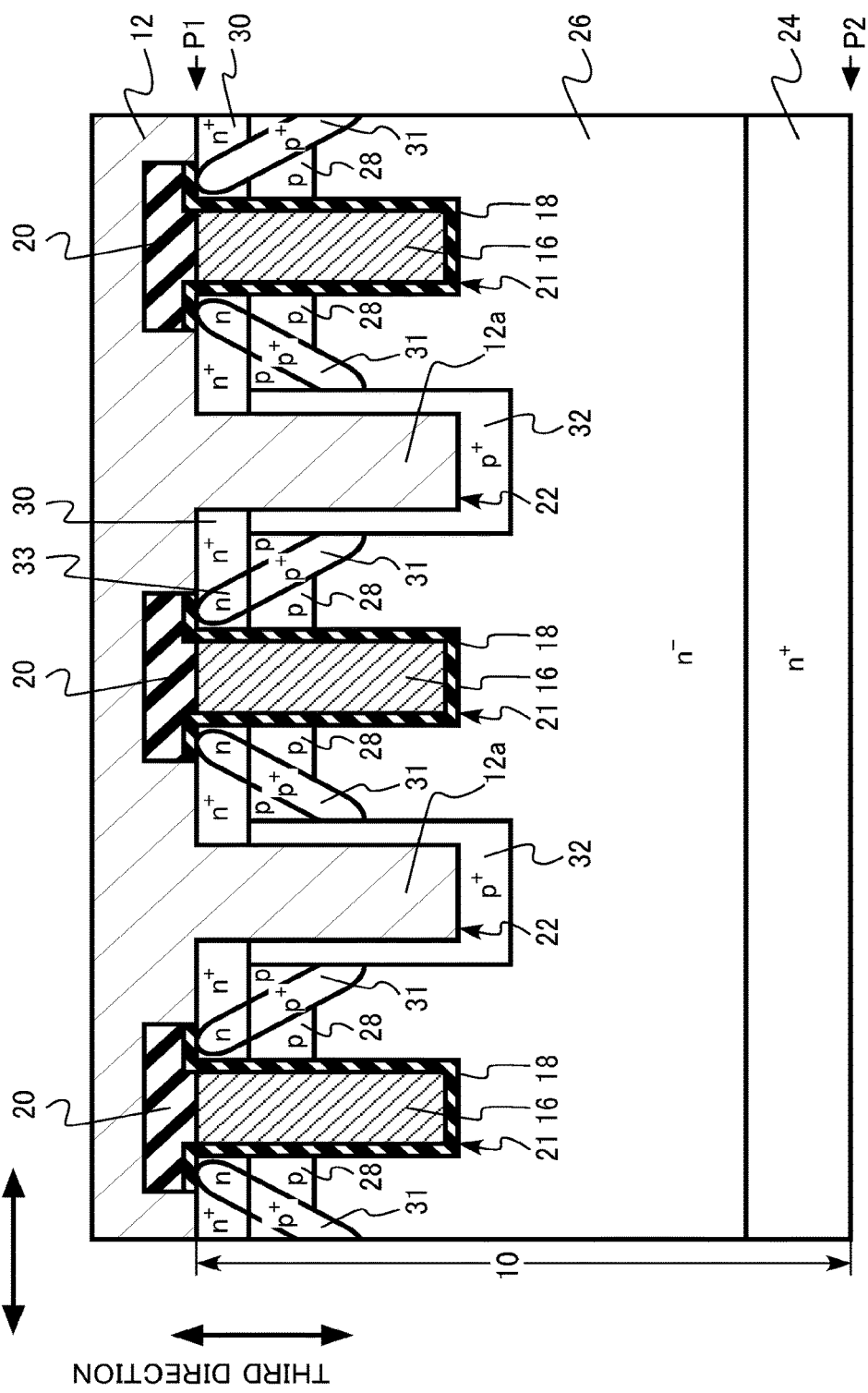
FIG. 19 is a schematic cross-sectional view illustrating an example of the method of manufacturing the semiconductor device according to the first embodiment.

Next, the mask material 56 is removed. Next, a source electrode 12 is formed in the contact trench 22 and on the second silicon oxide film 62 (FIG. 19). The source electrode 12 is formed, for example, by depositing a metal film by a CVD method.

After that, the drain electrode 14 is formed on the back surface of the silicon carbide layer 10 by using a known process technique.

A first position X and a second position Y exist in the high concentration region 31 in the body region 28 manufactured by the above manufacturing method. The first distance d1 from the first plane P1 to the first position X is smaller than the second distance d2 from the first plane P1 to the second position Y, and the third distance d3 from the gate insulating layer 18 to the first position X is smaller than the fourth distance d4 from the gate insulating layer 18 to the second position Y. The high concentration region 31 becomes deeper from the gate trench 21 toward the contact trench 22 in the body region 28.

By the above manufacturing method, the MOSFET 100 illustrated in FIGS. 1 to 3 is manufactured.

Next, the functions and effects of the semiconductor device according to the first embodiment and the method of manufacturing the semiconductor device will be described.

A trench gate structure in which the gate electrode 16 is provided in the gate trench 21 is applied to the MOSFET 100. By applying the trench gate structure, the channel area per unit area increased, and the on-resistance of the MOSFET 100 is reduced.

In addition, in the MOSFET 100, a contact region 12a that is a portion of the source electrode 12 is provided in the contact trench 22. The MOSFET 100 is a MOSFET having a so-called double trench structure.

By providing the contact region 12a in the contact trench 22, electrical connection to the body region 28 and the source region 30 can be acquired on the side surface of the contact trench 22. Therefore, the contact area of the source electrode 12 on the front surface of the silicon carbide layer 10 can be reduced. Therefore, the channel area per unit area increases, and the on-resistance of the MOSFET 100 decreases.

The MOSFET 100 includes the electric field relaxation region 32 around the bottom and side surfaces of the contact trench 22. Therefore, during the time of off-operation of the MOSFET 100, the electric field applied to the gate insulating layer 18 is relaxed. Therefore, the reliability of the gate insulating layer 18 is improved.

Figure 20:
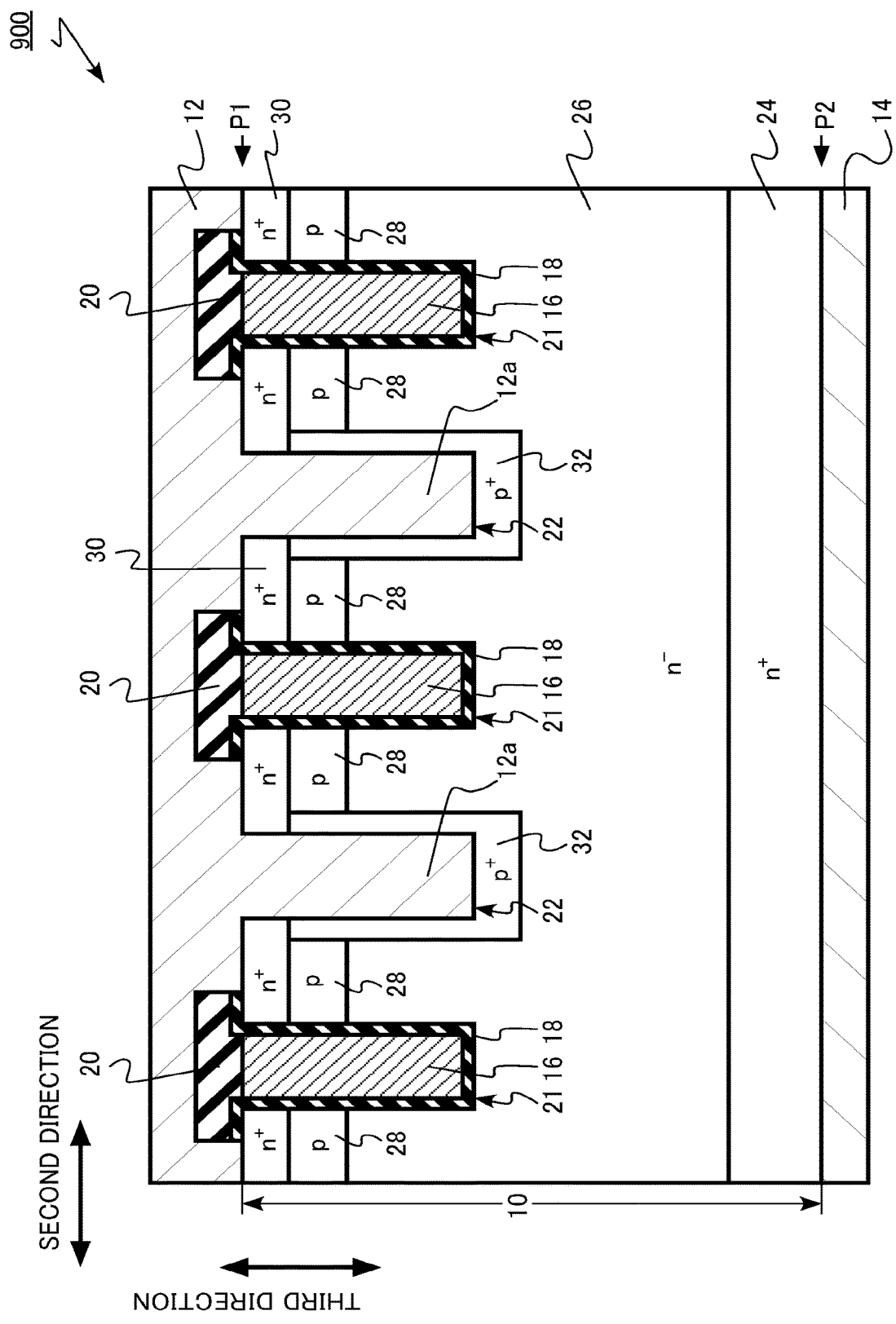
FIG. 20 is a schematic cross-sectional view of a semiconductor device according to Comparative Example.

FIG. 20 is a schematic cross-sectional view of a semiconductor device according to Comparative Example. The semiconductor device according to Comparative Example is a MOSFET 900 having a double trench structure.

The MOSFET 900 of Comparative Example is different from the MOSFET 100 according to the first embodiment in that the silicon carbide layer 10 does not have the p$^+$-type high concentration region 31 and the n-type high resistance region 33.

In the MOSFET 900, for example, if the thickness of the p-type body region 28 in the third direction can be reduced, the channel length of the MOSFET 900 can be shortened, and thus, the on-resistance can be reduced. However, if the thickness of the body region 28 in the third direction is reduced, there is concern that the threshold voltage of the MOSFET 900 decreases due to an electric field extending from the side of the drift region 26 to the body region 28. That is, the so-called short channel effect may become apparent.

If the thickness of the body region 28 in the third direction is reduced, punch-through occurs between the source region 30 and the drift region 26 at the time of turning off the MOSFET 900, and there is concern that the breakdown voltage of the MOSFET 100 is reduced.

The MOSFET 100 according to the first embodiment has a p$^+$-type high concentration region 31 in the body region 28.

The high concentration region 31 is provided at a position away from the gate insulating layer 18 in the second direction.

The high concentration region 31 is provided at a position away from the gate insulating layer 18 and the channel formation region by a certain distance in the body region 28, so that the extension of the electric field extending from the side of the drift region 26 to the body region 28 is suppressed. Therefore, the short channel effect is suppressed. Therefore, the thickness of the p-type body region 28 in the third direction can be reduced, and the on-resistance can be reduced.

The high concentration region 31 is provided at a position away from the gate insulating layer 18 in the second direction. Therefore, the fluctuation of the threshold value of the MOSFET 100 caused by providing the high concentration region 31 is suppressed.

In addition, according to the manufacturing method according to the first embodiment, when the high concentration region 31 is formed, the p-type impurities are ion-implanted into the body region 28 from the side of the contact trench 22. Therefore, the p-type impurities do not pass through the channel formation region on the side of the gate trench 21 during the time of ion implantation. Therefore, defects due to ion implantation damage do not occur in the channel formation region. Therefore, a decrease in carrier mobility due to defects is suppressed.

From the viewpoint of suppressing fluctuation of the threshold value of the MOSFET 100 caused by providing the high concentration region 31, the third distance d3 between the gate insulating layer 18 and the position X of the high concentration region 31 is preferably 0.05 µm or more, more preferably 0.1 µm or more.

In addition, from the viewpoint of suppressing the short channel effect, the third distance d3 between the gate insulating layer 18 and the position X of the high concentration region 31 is preferably a half or less, more preferably one-third or less of the distance (d5 in FIG. 3) between the gate insulating layer 18 and the contact trench 22. In addition, from the viewpoint of suppressing the short channel effect, the fourth distance d4 between the gate insulating layer 18 and the position Y of the high concentration region 31 is preferably 0.5 µm or less.

In addition, from the viewpoint of suppressing the short channel effect, it is preferable that the angle (θ in FIG. 3) of the segment (L in FIG. 3) connecting the first position X and the second position Y with respect to the normal line (dotted line in FIG. 3) of the first plane P1 is 50 degrees or less.

The high concentration region 31 becomes deeper from the gate trench 21 toward the contact trench 22 in the body region 28. In other words, a high concentration region 31 having a high p-type impurity concentration also exists in a portion of the body region 28 closer to the contact trench 22.

Since the high concentration region 31 having a high p-type impurity concentration also exists in a portion of the body region 28 closer to the contact trench 22, even in a case where the thickness of the p-type body region 28 in the third direction is reduced, punch-through between the source region 30 and the drift region 26 is suppressed. Therefore, a decrease in breakdown voltage of the MOSFET 100 is suppressed.

From the viewpoint of suppressing punch-through between the source region 30 and the drift region 26, it is preferable that the high concentration region 31 is in contact with the electric field relaxation region 32.

From the viewpoint of suppressing punch-through between the source region 30 and the drift region 26, it is preferable that the angle (θ in FIG. 3) of the segment (L in FIG. 3) connecting the first position X and the second position Y with respect to the normal line (dotted line in FIG. 3) of the first plane P1 is 20 degrees or more.

From the viewpoint of suppressing the short channel effect and the viewpoint of suppressing punch-through, the p-type impurity concentration at the first position X and the p-type impurity concentration at the second position Y are preferably 2 times or more, more preferably 5 times or more, further preferably 10 times or more of the p-type impurity concentration near the gate insulating layer 18 (for example, the position Z in FIG. 3) of the body region 28.

For example, in a case where a short circuit occurs in the load connected to the MOSFET 100 during the time of on-operation of the MOSFET 100, a large current flows through the MOSFET 100. If the current flowing during the time of the short circuit of the load increases, the time taken for the MOSFET 100 to be destroyed decreases. That is, the short-circuit withstand capability decreases.

The MOSFET 100 according to the first embodiment has an n-type high resistance region 33 in the source region 30. Therefore, in a case where a short circuit occurs in the load connected to the MOSFET 100, the current flowing through the MOSFET 100 can be reduced. Therefore, the short-circuit withstand capability of the MOSFET 100 is improved.

From the viewpoint of improving the short-circuit withstand capability of the MOSFET 100, it is preferable that the high resistance region 33 is in contact with the first plane P1. In addition, it is preferable that the high resistance region 33 is in contact with the high concentration region 31.

As described above, according to the first embodiment, it is possible to realize a MOSFET capable of reducing the on-resistance. In addition, it is possible to realize a MOSFET capable of suppressing a decrease in breakdown voltage. In addition, it is possible to realize a MOSFET capable of improving the short-circuit withstand capability.

Second Embodiment

A method of manufacturing a semiconductor device according to a second embodiment is different from the method of manufacturing the semiconductor device according to the first embodiment in that the first trench is formed after forming the fourth silicon carbide region. Hereinafter, a portion of contents overlapping with the semiconductor device according to the first embodiment may be omitted in description.

Hereinafter, an example of the method of manufacturing the semiconductor device according to the second embodiment will be described. The method of manufacturing a semiconductor device according to the second embodiment is the method of manufacturing the MOSFET 100 according to the first embodiment.

FIGS. 21, 22, 23, and 24 are schematic cross-sectional views illustrating an example of the method of manufacturing the semiconductor device according to the second embodiment. FIGS. 21, 22, 23, and 24 illustrate cross sections corresponding to FIG. 1.

The processes up to the formation of the $n^+$-type source region 30 are the same as those in the method of manufacturing the semiconductor device according to the first embodiment.

Next, a mask material 50 is formed on the front surface of the silicon carbide layer 10 (FIG. 20). The mask material 50 has an opening 70.

Figure 21:
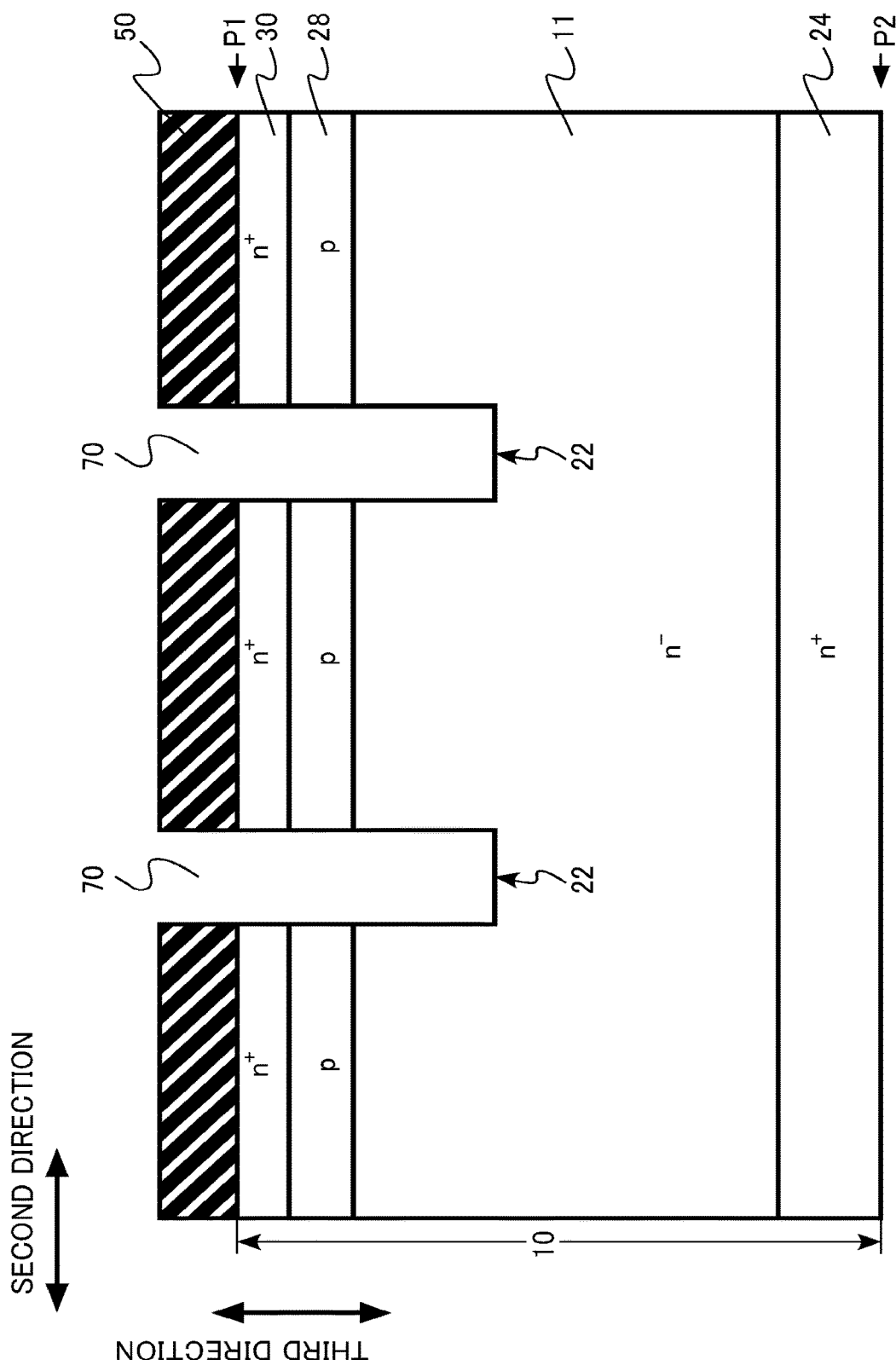
FIG. 21 is a schematic cross-sectional view illustrating an example of a method of manufacturing the semiconductor device according to a second embodiment.

Next, a contact trench 22 (second trench) is formed by using the mask material 50 as a mask (FIG. 21). The contact trench 22 is formed in the silicon carbide layer 10 below the opening 70 of the mask material 50.

Figure 22:
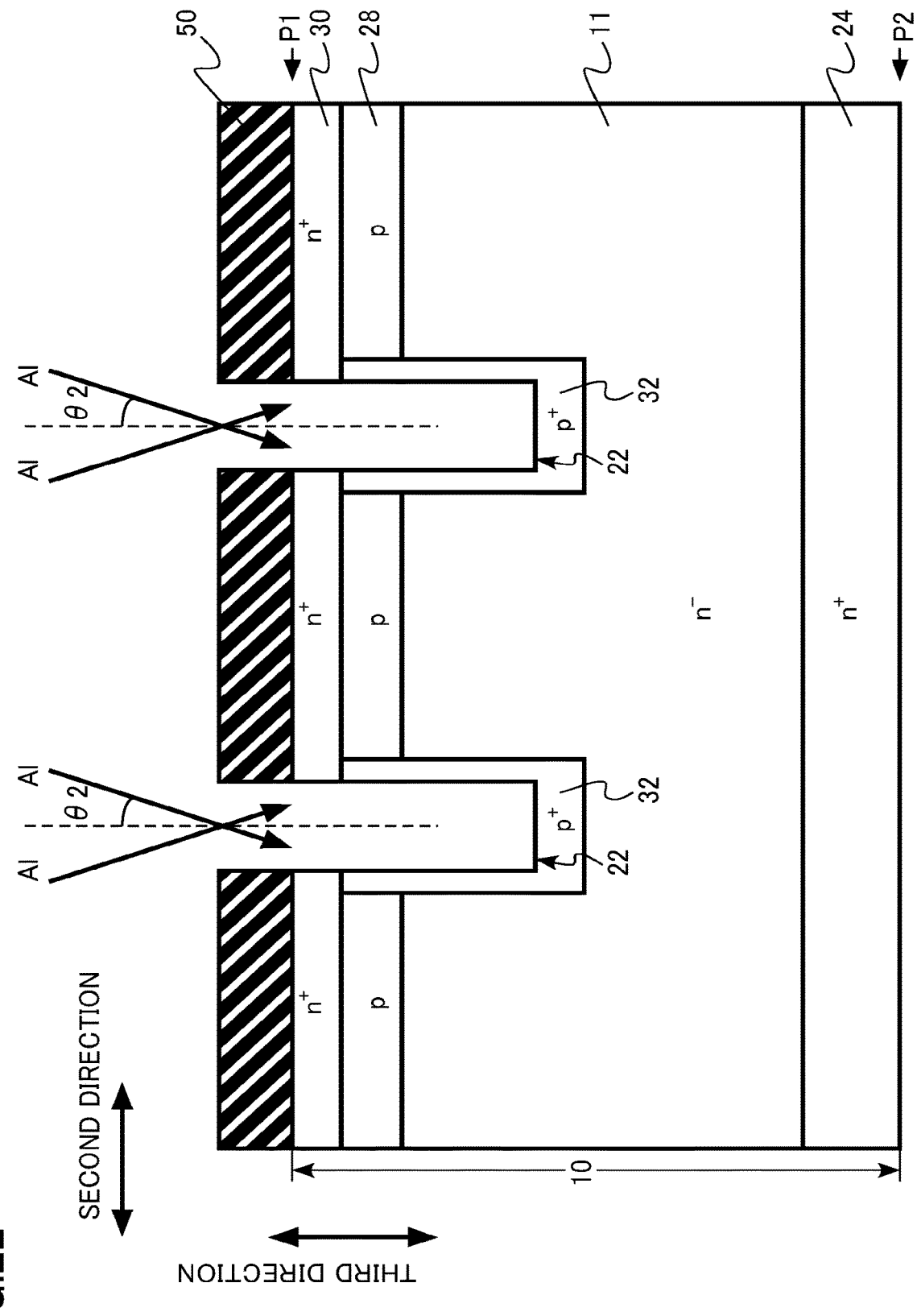
FIG. 22 is a schematic cross-sectional view illustrating an example of the method of manufacturing the semiconductor device according to the second embodiment.

Next, a p+-type electric field relaxation region 32 is formed (FIG. 22). The electric field relaxation region 32 is formed by implanting p-type impurities into the contact trench 22 by oblique ion implantation method by using the mask material 52 and the mask material 50 as a mask. The p-type impurity is, for example, an aluminum ion. Aluminum ions are ion-implanted in a direction inclined at a second angle (θ2 in FIG. 22) with respect to a normal line (dotted line in FIG. 22) of the first plane P1. The p+-type electric field relaxation region 32 is formed near the side and bottom surfaces of the contact trench 22 in the silicon carbide layer 10.

Figure 23:
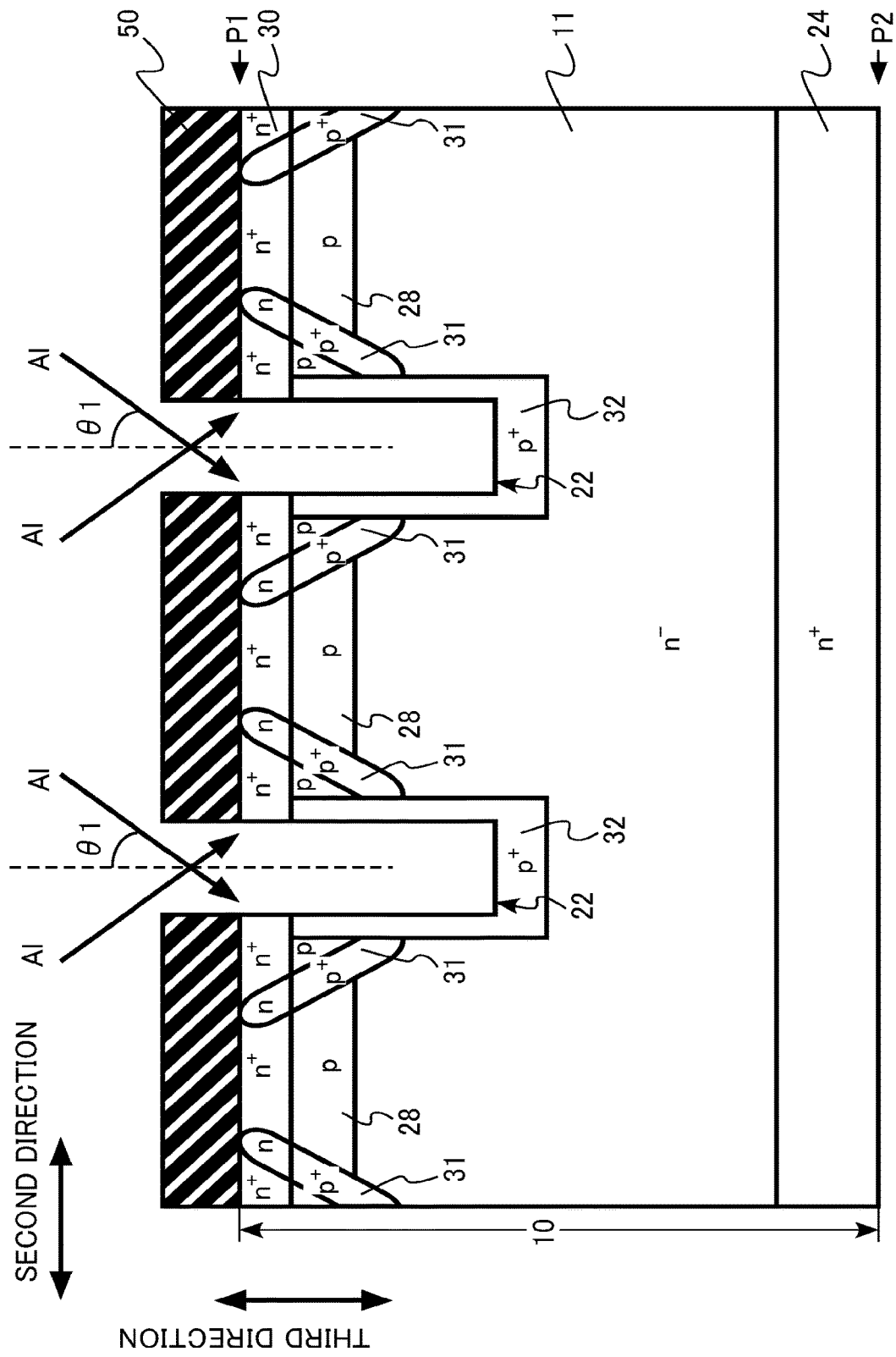
FIG. 23 is a schematic cross-sectional view illustrating an example of the method of manufacturing the semiconductor device according to the second embodiment.

Next, a p+-type high concentration region 31 is formed (FIG. 23). The high concentration region 31 is formed by implanting p-type impurities into the contact trench 22 by oblique ion implantation method by using the mask material 52 and the mask material 50 as a mask. The p-type impurities are aluminum ions. Aluminum ions are ion-implanted in a direction inclined at a first angle (θ1 in FIG. 23) with respect to a normal line (dotted line in FIG. 23) of the first plane P1.

The first angle θ1 is larger than the second angle θ2. In other words, the second angle θ2 is smaller than the first angle θ1.

Next, the mask material 51 is peeled off. Next, a mask material 53 is formed. The mask material 53 is, for example, a silicon oxide film. The mask material 53 covers the contact trench 22.

Figure 24:
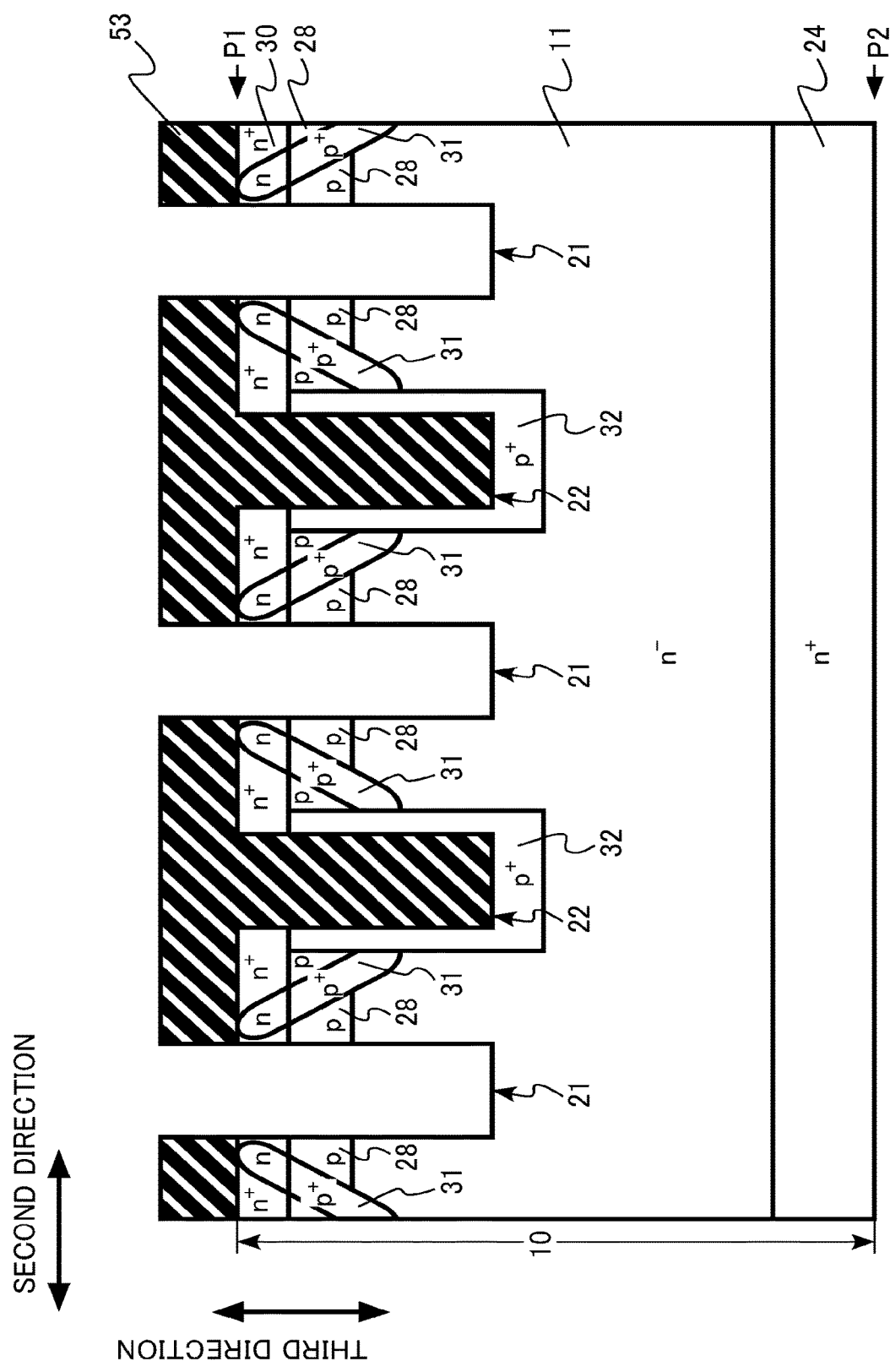
FIG. 24 is a schematic cross-sectional view illustrating an example of the method of manufacturing the semiconductor device according to the second embodiment.

Next, a gate trench 21 (first trench) is formed by using the mask material 53 as a mask (FIG. 24).

Next, the mask material 53 is peeled off. After that, the MOSFET 100 illustrated in FIGS. 1 to 3 is manufactured by the same manufacturing method as the method of manufacturing the semiconductor device according to the first embodiment.

A first position X and a second position Y exist in the high concentration region 31 in the body region 28 manufactured by the method of manufacturing the semiconductor device according to the second embodiment. A first distance d1 from the first plane P1 to the first position X is smaller than a second distance d2 from the first plane P1 to the second position Y, and a third distance d3 from the gate insulating layer 18 to the first position X is smaller than a fourth distance d4 from the gate insulating layer 18 to the second position Y. The high concentration region 31 becomes deeper from the gate trench 21 toward the contact trench 22 in the body region 28.

In the method of manufacturing the semiconductor device according to the second embodiment, unlike the method of manufacturing the semiconductor device according to the first embodiment, the gate trench 21 and the contact trench 22 can be formed independently. Therefore, for example, the contact trench 22 having a depth or a taper angle of the side surface different from that of the gate trench 21 can be easily formed.

As described above, according to the second embodiment, it is possible to realize a MOSFET capable of reducing the on-resistance. In addition, it is possible to realize a MOSFET capable of suppressing a decrease in breakdown voltage. In addition, it is possible to realize a MOSFET capable of improving the short-circuit withstand capability.

Third Embodiment

A semiconductor device according to a third embodiment is different from the semiconductor device according to the first embodiment in that the silicon carbide layer does not have a second trench. Hereinafter, a portion of contents overlapping with the semiconductor device according to the first embodiment may be omitted in description.

Figure 25:
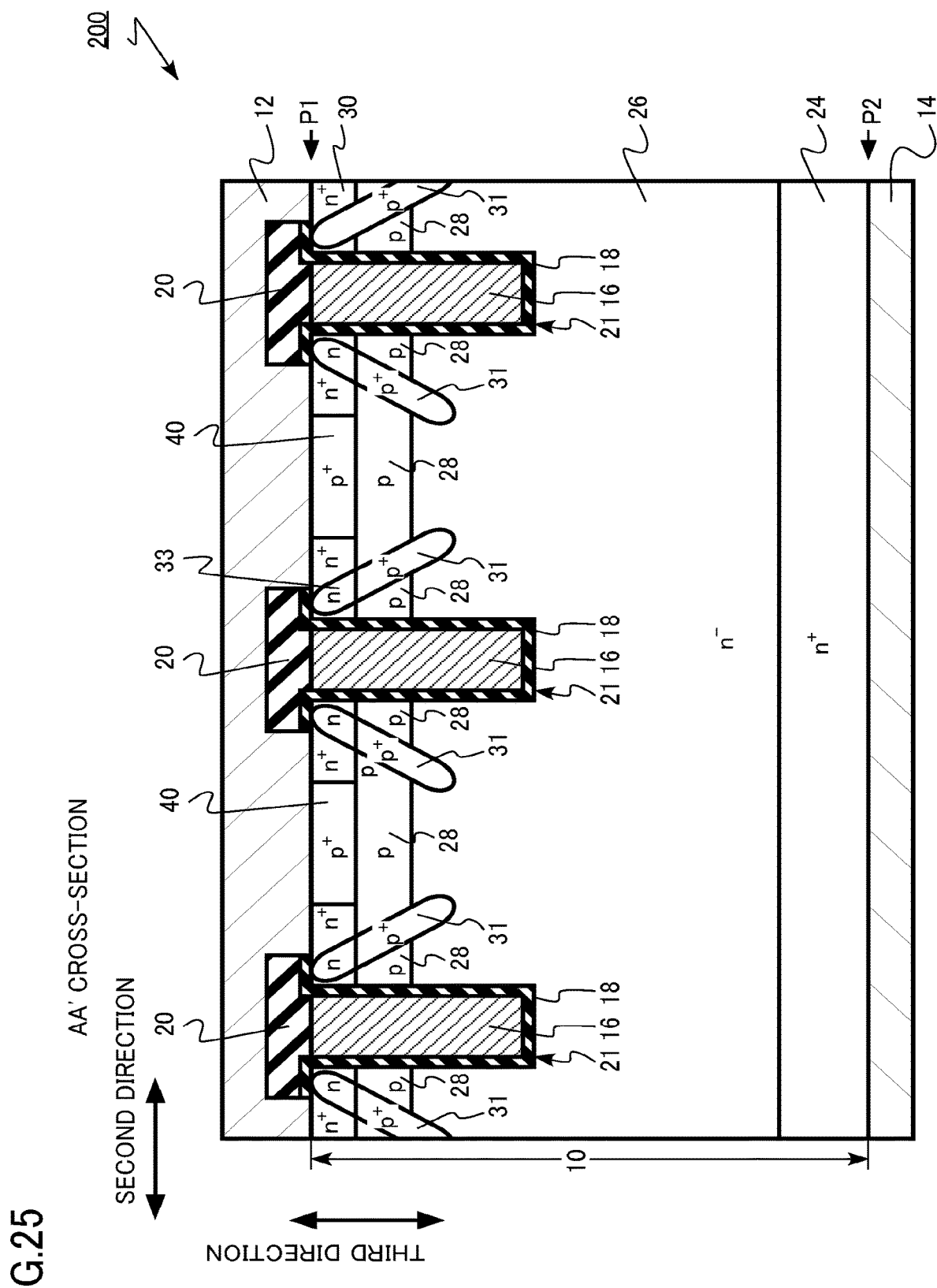
FIG. 25 is a schematic cross-sectional view of a semiconductor device according to a third embodiment.

FIG. 25 is a schematic cross-sectional view of the semiconductor device according to the third embodiment. FIG. 25 is a view corresponding to FIG. 1 of the first embodiment.

The semiconductor device according to the third embodiment includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 includes a gate trench 21 (first trench), an n+-type drain region 24, an n−-type drift region 26 (first silicon carbide region), and a p-type body region 28 (second silicon carbide region), an n+-type source region 30 (third silicon carbide region), a p+-type high concentration region 31 (fourth silicon carbide region), an n-type high resistance region 33 (fifth silicon carbide region), and a p+-type contact 40.

The silicon carbide layer 10 does not include a contact trench. The source electrode 12 is in contact with the p+-type contact 40 on the first plane P1.

Figure 26:
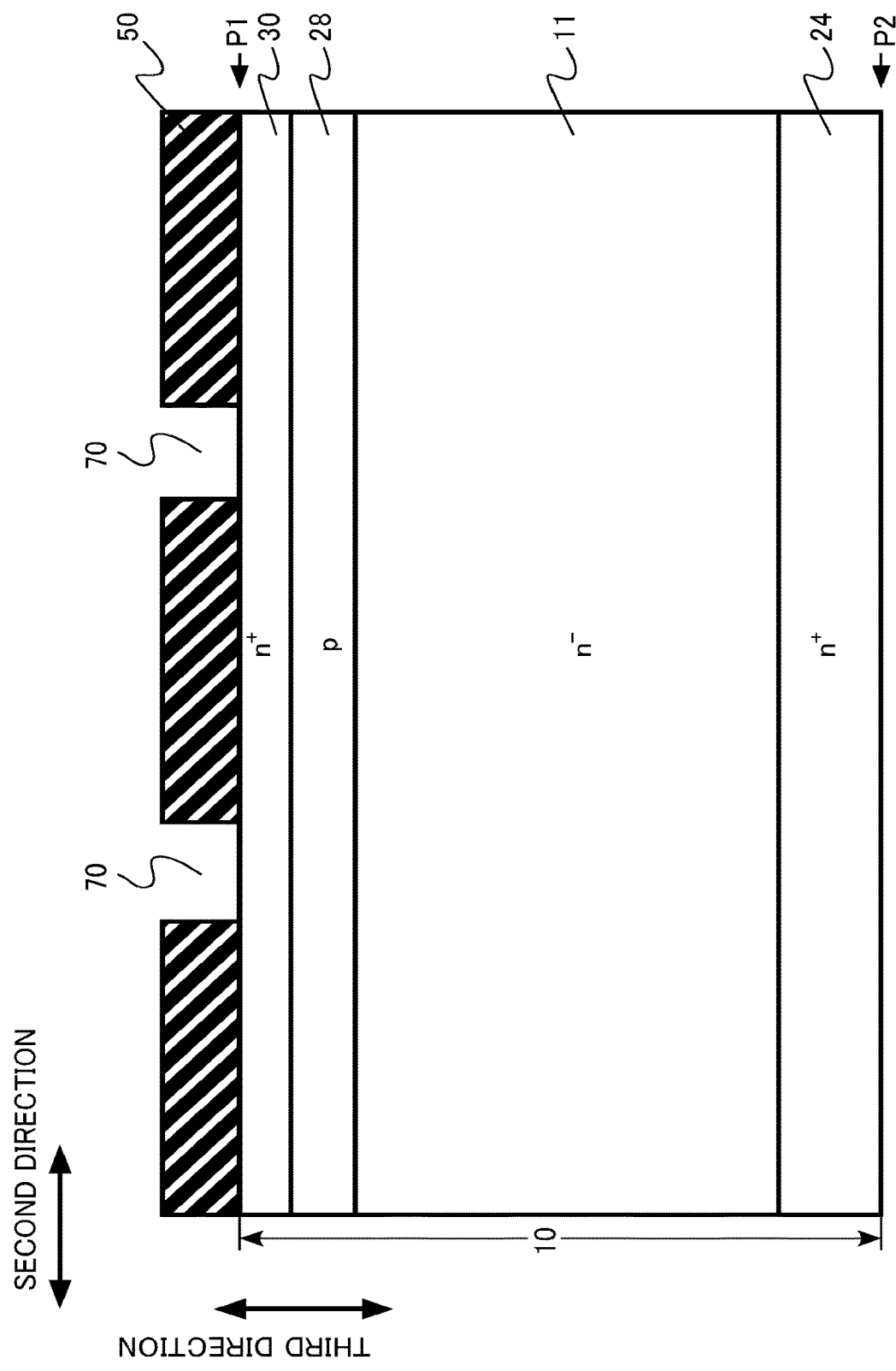
FIG. 26 is a schematic cross-sectional view illustrating an example of a method of manufacturing the semiconductor device according to the third embodiment.
Figure 27:
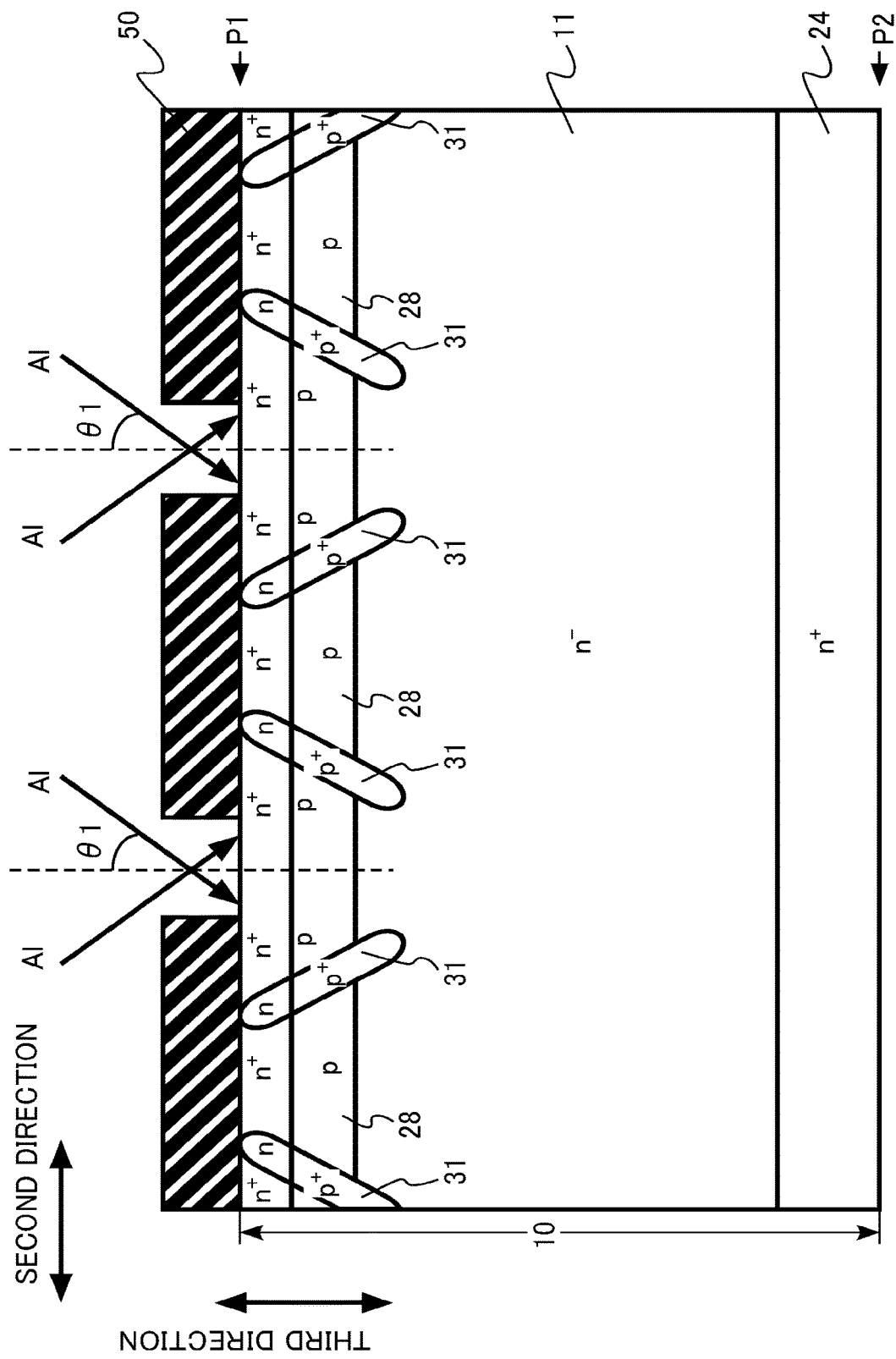
FIG. 27 is a schematic cross-sectional view illustrating an example of the method of manufacturing the semiconductor device according to the third embodiment.

FIGS. 26 and 27 are schematic cross-sectional views illustrating an example of a method of manufacturing a semiconductor device according to the third embodiment. FIGS. 26 and 27 illustrate cross-sections corresponding to FIG. 25.

The processes up to the formation of the n+-type source region 30 are the same as those in the method of manufacturing the semiconductor device according to the first embodiment.

Next, a mask material 50 is formed on the front surface of the silicon carbide layer 10 (FIG. 26). The mask material 50 has an opening 70.

Next, a p+-type high concentration region 31 is formed (FIG. 27). The high concentration region 31 is formed by implanting p-type impurities into the silicon carbide layer 10 by oblique ion implantation method using the mask material 50 as a mask. The p-type impurities are, for example, aluminum ions. Aluminum ions are ion-implanted in a direction inclined at a first angle (θ1 in FIG. 27) with respect to a normal line (dotted line in FIG. 27) of the first plane P1.

After that, using the same processes technology as those of the method of manufacturing the semiconductor device according to the first embodiment, a p+-type contact 40, a gate trench 21 (first trench), a source electrode 12 (first electrode), a drain electrode 14 (second electrode), a gate electrode 16, a gate insulating layer 18, and an interlayer insulating layer 20 are formed. With the above manufacturing method, the MOSFET 200 illustrated in FIG. 25 is manufactured.

As described above, according to the third embodiment, it is possible to realize a MOSFET that can reduce the on-resistance. In addition, it is possible to realize a MOSFET capable of suppressing a decrease in breakdown voltage. In addition, it is possible to realize a MOSFET capable of improving short-circuit withstand capability.

Fourth Embodiment

An inverter circuit and a driving device according to a fourth embodiment are driving devices including the semiconductor device according to the first embodiment.

Figure 28:
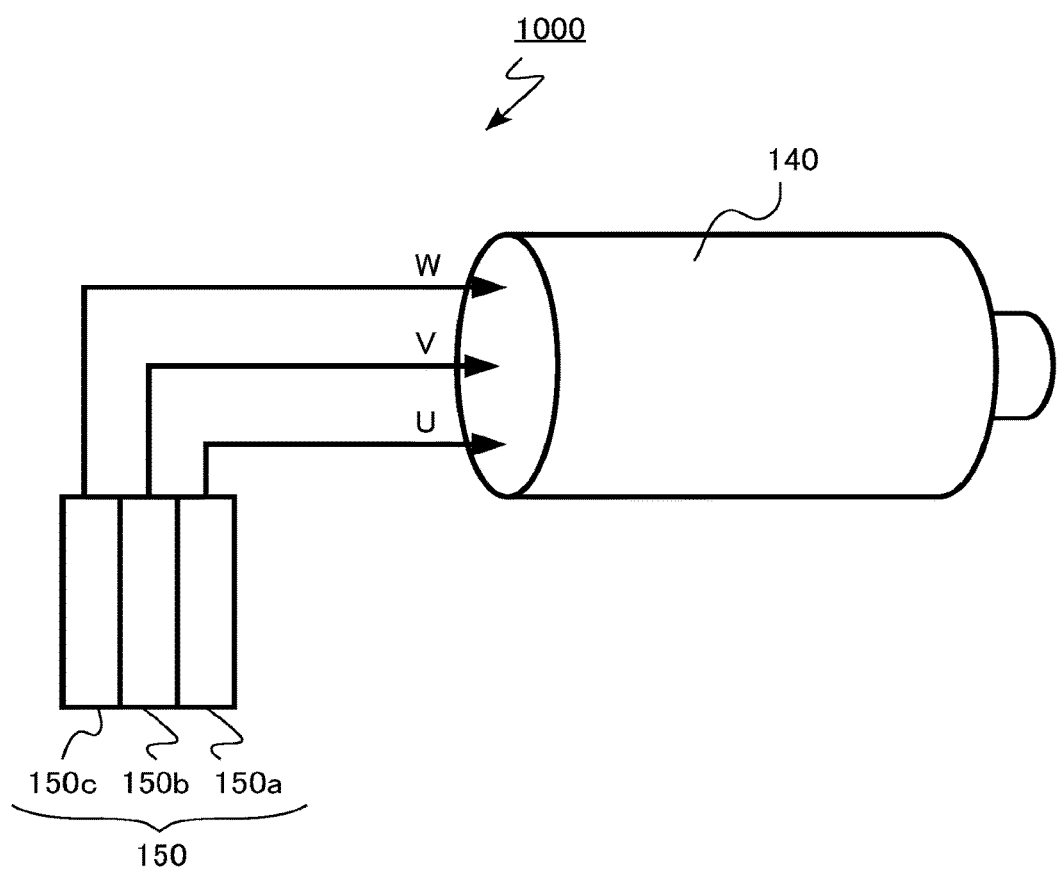
FIG. 28 is a schematic view of a driving device according to a fourth embodiment.

FIG. 28 is a schematic view of the driving device according to the fourth embodiment. The driving device 1000 includes a motor 140 and an inverter circuit 150.

The inverter circuit 150 is configured with three semiconductor modules 150a, 150b, and 150c using the MOSFET 100 according to the first embodiment as a switching element. By connecting the three semiconductor modules 150a, 150b, 150c in parallel, a three-phase inverter circuit 150 having three AC voltage output terminals U, V, and W is realized. The motor 140 is driven by the AC voltage output from the inverter circuit 150.

According to the fourth embodiment, by providing the MOSFET 100 with improved characteristics, the characteristics of the inverter circuit 150 and the driving device 1000 are improved.

Fifth Embodiment

A vehicle according to a fifth embodiment is a vehicle including the semiconductor device according to the first embodiment.

Figure 29:
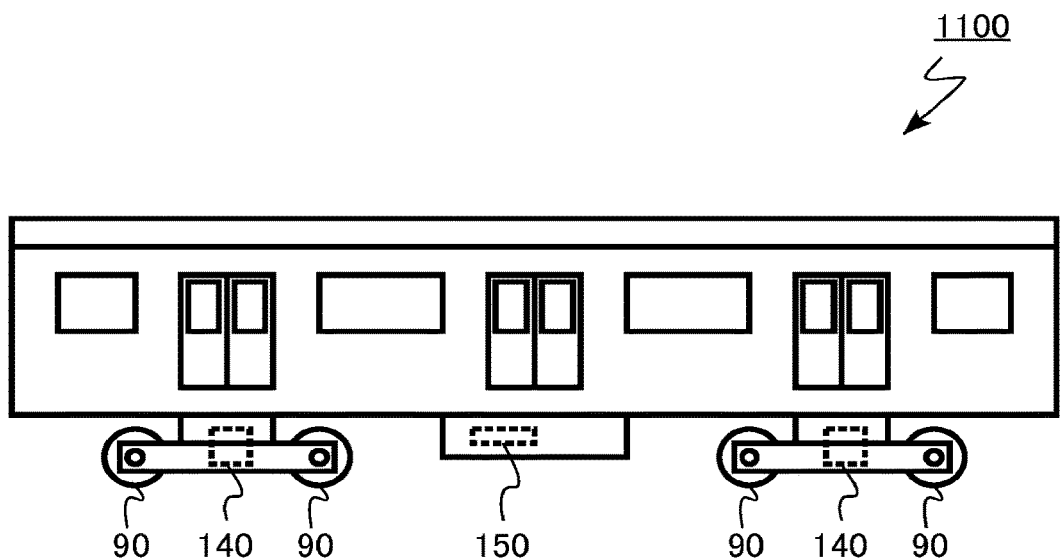
FIG. 29 is a schematic view of a vehicle according to a fifth embodiment.

FIG. 29 is a schematic view of a vehicle according to the fifth embodiment. The vehicle 1100 according to the fifth embodiment is a railway vehicle. The vehicle 1100 includes a motor 140 and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized. The motor 140 is driven by the AC voltage output from the inverter circuit 150. The wheels 90 of the vehicle 1100 are rotated by the motor 140.

According to the fifth embodiment, by providing the MOSFET 100 with improved characteristics, the characteristics of the vehicle 1100 are improved.

Sixth Embodiment

A vehicle according to a sixth embodiment is a vehicle including the semiconductor device according to the first embodiment.

Figure 30:
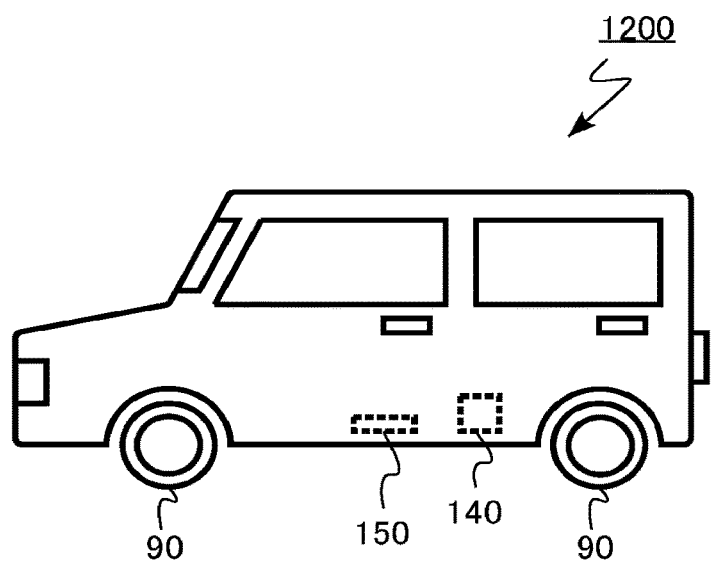
FIG. 30 is a schematic view of a vehicle according to a sixth embodiment.

FIG. 30 is a schematic view of a vehicle according to the sixth embodiment. The vehicle 1200 according to the sixth embodiment is an automobile. The vehicle 1200 includes a motor 140 and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized.

The motor 141 is driven by the AC voltage output from the inverter circuit 150. The wheels 90 of the vehicle 1200 are rotated by the motor 140.

According to the sixth embodiment, by providing the MOSFET 100 with improved characteristics, the characteristics of the vehicle 1200 are improved.

Seventh Embodiment

An elevator according to a seventh embodiment is an elevator including the semiconductor device according to the first embodiment.

Figure 31:
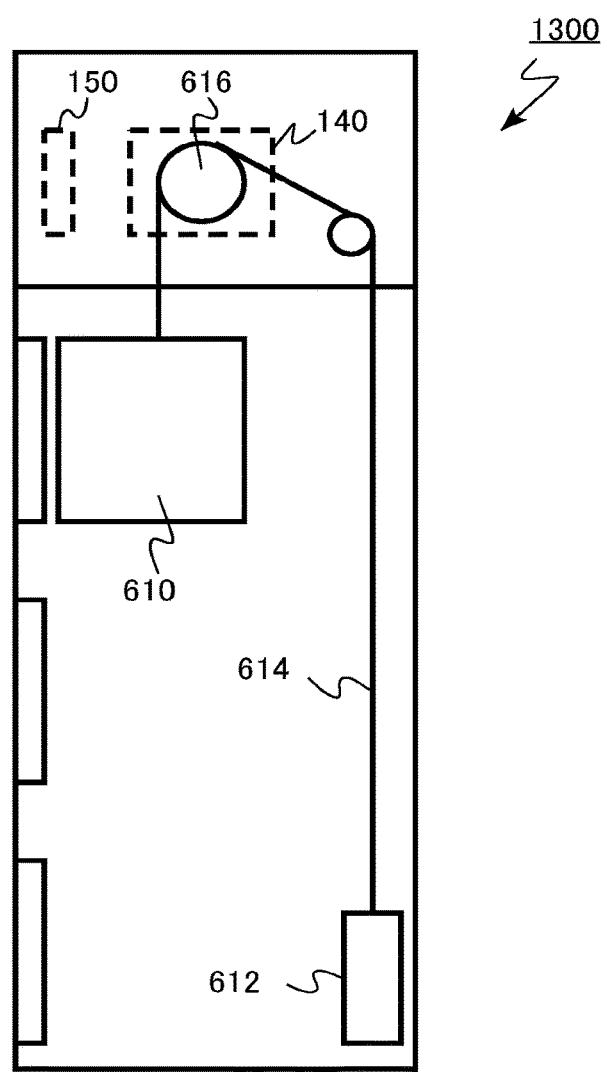
FIG. 31 is a schematic view of an elevator according to a seventh embodiment.

FIG. 31 is a schematic view of an elevator (lift) according to the seventh embodiment. The elevator 1300 according to the seventh embodiment includes a basket 610, a counterweight 612, a wire rope 614, a hoist 616, a motor 140, and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized.

The motor 140 is driven by the AC voltage output from the inverter circuit 150. The hoist 616 is rotated by the motor 140, and the basket 610 is raised and lowered.

According to the seventh embodiment, by providing the MOSFET 100 with improved characteristics, the characteristics of the elevator 1300 are improved.

As described above, in the first to third embodiments, a case where the crystal structure of silicon carbide is 4H—SiC has been described as an example, but the embodiments can be applied to silicon carbides with other crystal structures such as 6H—SiC and 3C—SiC.

In addition, in the fourth to seventh embodiments, a case where the semiconductor device according to the first embodiment is provided has been described as an example, but the semiconductor device according to the third embodiment can be applied.

In addition, in the fourth to seventh embodiments, a case where the semiconductor device according to the embodiments is applied to a vehicle or an elevator has been described as an example, but the semiconductor device according to the embodiments can be applied to, for example, a power conditioner or the like of a solar power generation system.

While certain embodiments have been described, these embodiments have been presented by way of example only, and are not intended to limit the scope of the inventions. Indeed, semiconductor devices, methods of manufacturing a semiconductor device, inverter circuits, driving devices, vehicles, and elevators described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane parallel to a first direction and a second direction perpendicular to the first direction and a second plane facing the first plane, the silicon carbide layer having
   a first trench being located on a side of the first plane and extending in the first direction,
   a first silicon carbide region of n-type,
   a second silicon carbide region of p-type being located between the first silicon carbide region and the first plane,
   a third silicon carbide region of n-type being located between the second silicon carbide region and the first plane, and
   a fourth silicon carbide region of p-type being located between the first silicon carbide region and the first plane, at least a portion of the fourth silicon carbide region being located in the second silicon carbide region, the fourth silicon carbide region having a higher p-type impurity concentration than a p-type impurity concentration of the second silicon carbide region;
   a gate electrode being located in the first trench;
   a gate insulating layer being located between the gate electrode and the silicon carbide layer;

a first electrode being located on a side of the first plane of the silicon carbide layer; and a second electrode being located on a side of the second plane of the silicon carbide layer, wherein a first position and a second position exist in the at least portion of the fourth silicon carbide region, a first distance from the first plane to the first position is smaller than a second distance from the first plane to the second position, and a third distance from the gate insulating layer to the first position is smaller than a fourth distance from the gate insulating layer to the second position.

2. The semiconductor device according to claim 1,
wherein the first concentration distribution of the p-type impurity on a first virtual line including the first position and extending in the second direction has a first concentration peak at the first position, and the second concentration distribution of the p-type impurity on a second virtual line including the second position and extending in the second direction has a second concentration peak at the second position.

3. The semiconductor device according to claim 1, wherein an angle of a segment connecting the first position and the second position with respect to a normal line of the first plane is 20 degrees or more and 50 degrees or less.

4. The semiconductor device according to claim 1, wherein the second silicon carbide region is located between the gate insulating layer and the fourth silicon carbide region.

5. The semiconductor device according to claim 1, wherein the third distance is 0.05 µm or more, and the fourth distance is 0.5 µm or less.

6. The semiconductor device according to claim 1, wherein the p-type impurity concentration at the first position and the p-type impurity concentration at the second position are 2 times or more and 100 times or less of the p-type impurity concentration of the second silicon carbide region near the gate insulating layer.

7. The semiconductor device according to claim 1, wherein the fourth silicon carbide region is in contact with the third silicon carbide region.

8. The semiconductor device according to claim 7, wherein the silicon carbide layer further includes a fifth silicon carbide region of n-type being located in the third silicon carbide region, the fifth silicon carbide region being located between the fourth silicon carbide region and the first plane, and the fifth silicon carbide region having an n-type impurity concentration lower than an n-type impurity concentration of the third silicon carbide region.

9. The semiconductor device according to claim 1, wherein the fourth silicon carbide region is in contact with the first silicon carbide region.

10. The semiconductor device according to claim 1, further comprising a second trench being located on a side of the first plane and extending in the first direction, wherein a portion of the first electrode is located in the second trench, and the fourth silicon carbide region is located between the first trench and the second trench.

11. The semiconductor device according to claim 10, wherein the third distance is a half or less of a distance between the gate insulating layer and the second trench.

12. The semiconductor device according to claim 10, wherein the silicon carbide layer further includes a sixth silicon carbide region of p-type being located between the second trench and the first silicon carbide region, and having a p-type impurity concentration higher than a p-type impurity concentration of the second silicon carbide region.

13. The semiconductor device according to claim 12, wherein the fourth silicon carbide region is in contact with the sixth silicon carbide region.

14. An inverter circuit comprising the semiconductor device according to claim 1.

15. A driving device comprising the semiconductor device according to claim 1.

16. A vehicle comprising the semiconductor device according to claim 1.

17. An elevator comprising the semiconductor device according to claim 1.

18. A method of manufacturing a semiconductor device comprising:

forming a second silicon carbide region of p-type on a side of a first plane of a silicon carbide layer, the silicon carbide layer having a first plane, a second plane facing the first plane, and a first silicon carbide region of n-type located between the second plane and the first plane;

forming a third silicon carbide region of n-type between the second silicon carbide region and the first plane;

forming a mask material having an opening on a side of the first plane of the silicon carbide layer;

forming a fourth silicon carbide region of p-type by ion-implanting p-type impurities into the silicon carbide layer in a direction inclined at a first angle with respect to a normal line of the first plane by using the mask material as a mask, at least a portion of the fourth silicon carbide region being located in the second silicon carbide region;

forming a first trench on a side of the first plane of the silicon carbide layer;

forming a gate insulating layer in the first trench; and forming a gate electrode on the gate insulating layer in the first trench, wherein a first position and a second position exist in the at least a portion of the fourth silicon carbide region, a first distance from the first plane to the first position is smaller than a second distance from the first plane to the second position, and a third distance from the gate insulating layer to the first position is smaller than a fourth distance from the gate insulating layer to the second position.

19. The method of manufacturing a semiconductor device according to claim 18, wherein before forming the fourth silicon carbide region, the first trench is formed.

20. The method of manufacturing a semiconductor device according to claim 18, wherein a second trench is formed in the silicon carbide layer below the opening by etching the silicon carbide layer by using the mask material as a mask.

\* \* \* \* \*